(12) United States Patent
Blackburn et al.

(10) Patent No.: US 6,984,584 B2
(45) Date of Patent: Jan. 10, 2006

(54) CONTAMINATION SUPPRESSION IN CHEMICAL FLUID DEPOSITION

(75) Inventors: Jason M. Blackburn, Santa Clara, CA (US); Albertina Cabanas, Ware, MA (US); James J. Watkins, South Hadley, MA (US)

(73) Assignee: University of Massachusetts, Boston, MA (US)

( * ) Notice: Subject to any disclaimer, the term of this patent is extended or adjusted under 35 U.S.C. 154(b) by 113 days.

(21) Appl. No.: 10/327,515

(22) Filed: Dec. 20, 2002

(65) Prior Publication Data

US 2003/0161954 A1 Aug. 28, 2003

Related U.S. Application Data

(60) Provisional application No. 60/343,110, filed on Dec. 21, 2001.

(51) Int. Cl.
*H01L 21/44* (2006.01)

(52) U.S. Cl. .................. 438/682; 438/681; 438/686

(58) Field of Classification Search ............... 438/758, 438/680, 681, 686, 687; 427/250, 255.19, 427/299
See application file for complete search history.

(56) References Cited

U.S. PATENT DOCUMENTS

| 4,970,093 A | 11/1990 | Sievers et al. ............... 427/39 |
| 5,789,027 A * | 8/1998 | Watkins et al. ............. 427/250 |
| 6,306,754 B1 | 10/2001 | Agarwal ..................... 438/619 |

* cited by examiner

*Primary Examiner*—Alexander Ghyka
(74) *Attorney, Agent, or Firm*—Fish & Richardson P.C.

(57) ABSTRACT

Methods for depositing materials onto a substrate surface or into a porous solid are disclosed. These methods include suppressing contamination of the deposited materials.

34 Claims, 13 Drawing Sheets

CONTAMINATION SUPPRESSION IN CHEMICAL FLUID DEPOSITION

CROSS-REFERENCE TO RELATED APPLICATIONS

This application claims priority to Provisional Patent Application No. 60/343,110, entitled "CONTAMINATION SUPPRESSION IN CHEMICAL FLUID DEPOSITION," filed on Dec. 21, 2001, the entire contents of which are hereby incorporated in their entirety.

BACKGROUND

This invention relates to methods for depositing materials onto a substrate surface or into a porous solid.

Thin films of materials such as metals, semiconductors, or metal oxide insulators are of great importance in the microelectronics industry. Fabrication of integrated circuits involves formation of high purity thin films, often with multiple layers, on patterned substrates. One of the most common methods for producing thin films is chemical vapor deposition (CVD). In thermal CVD, volatile precursors are vaporized under reduced pressure at temperatures below their thermal decomposition temperature and transported by means of a carrier gas into an evacuated chamber containing a substrate. The substrate is heated to high temperatures, and thermolysis at or adjacent to the heated substrate results in the surface deposition of the desired film. For a general reference on CVD see: Hitchman et al., eds., *Chemical Vapor Deposition Principles and Applications* (Academic Press, London, 1993).

Thin films have also been formed using supercritical fluids. For example, Murthy et al. (U.S. Pat. No. 4,737,384) describes a physical deposition method in which a metal or polymer is dissolved in a solvent under supercritical conditions and as the system is brought to sub-critical conditions the metal or polymer precipitates onto an exposed substrate as a thin film. Sievers et al. (U.S. Pat. No. 4,970,093) describes a standard CVD method in which organometallic CVD precursors are delivered to a conventional CVD reactor by dissolving the precursors in a supercritical fluid solvent. The solvent is expanded to produce a fine precursor aerosol, which is injected into the CVD reactor under standard CVD conditions to deposit a thin film on a substrate.

Louchev et al. (*J. Crystal Growth*, 155:276–285, 1995) describes the transport of a precursor to a heated substrate (700 K) in a supercritical fluid where it undergoes thermolysis to yield a thin metal (copper) film. Though the process takes place under high pressure, the temperature in the vicinity of the substrate is high enough that the density of the supercritical fluid approaches the density of a conventional gas. The film produced by this method had an atomic copper concentration of approximately 80% (i.e., 20% impurities). Bouquet et al. (*Surf. and Coat. Tech.*, 70:73–78, 1994) describe a method in which a metal oxide is deposited from a supercritical mixture of liquid and gas co-solvents at a temperature of at least 240° C. The thin film forms as a result of thermolysis at a substrate heated to at least 290° C.

The formation of alloys from multiple pure metal components and films containing multiple pure metal components is also of interest in microelectronic applications and device fabrication for the formation of films exhibiting characteristics such as gigantic magneto resistance (GMR) or increased resistance to electromigration or for modification of electrical conductivity, and for the formation of other functional layers in integrated circuits. Alloying is also used to tailor rate and selectivity for reactions over supported catalysts, to improve the resistance of metal membranes to hydrogen embrittlement, and to increase the hardness and corrosion resistance of barrier coatings. Mixed metal films are typically produced by physical deposition methods such as ion sputtering, which is a line-of-sight technique.

SUMMARY

The invention is based on the discovery that contamination, e.g., oxidation, of material deposited onto a substrate surface or into a porous solid can be suppressed through the appropriate selection of a material precursor, delivery agent (e.g., solvent), reaction conditions (e.g., temperature), and/or or presence of additional reagents. Certain precursors can dissociate (e.g., by thermal disproportionation) under suitable conditions to deposit a layer of material on the substrate surface. However, in the presence of certain reaction reagents, e.g., an oxidizing agent, the deposit can be contaminated, e.g., by oxidation. By providing a suitable reaction reagent, contamination of the deposited material can be reduced/suppressed. For example, where the contamination is due to oxidation, a reducing agent can be a suitable reaction reagent. By suppressing contamination, desired materials can be deposited onto a substrate at a high purity (e.g., better than 95, 97, or even 99 weight percent).

The invention also features methods for depositing a material, e.g., a thin film of a pure metal, a mixed metal, or a metal alloy, or a layer, e.g., a discontinuous layer of discrete uniformly distributed clusters, onto a substrate surface or into a porous solid substrate with reduced contamination. These methods are generally referred to herein as chemical fluid deposition (CFD). CFD involves dissolving a precursor of the material to be deposited into a solvent under supercritical or near-supercritical conditions and exposing the substrate (or porous solid) to the solution. A chemical reaction involving the precursor is initiated, e.g., thermally or by introducing a reaction reagent into the solution, thereby depositing material onto the substrate surface (or within the porous solid).

Use of a supercritical solvent with suitable means of contamination suppression produces high purity thin films, e.g., metal or metal alloy films, or layers of discrete high purity metal or metal alloy clusters, at temperatures that can be lower than conventional CVD temperatures. The substrate surface can include one or more layers, which may be patterned. When patterned substrates, e.g., having deep sub-micron, high-aspect ratio features such as trenches, are used, CFD can provide uniform conformal coverage and uniform filling of the features.

Usually, CFD involves dissolving a precursor of a material in a solvent and exposing a substrate to the solvent under supercritical or near-supercritical conditions. In many cases, the precursor is stable under the exposure conditions, and dissociates only after addition of a reaction reagent to the solution. However, some precursors can be unstable under the exposure conditions (e.g., at the exposure temperature) and can dissociate without the addition of a reaction reagent to the solution. Dissociation typically results in material depositing on a substrate surface.

In embodiments where the precursor dissociates without the addition of a reaction reagent, it may be desirable to include a reaction reagent to reduce/suppress contamination of the deposited material. For example, some organo-metallic precursors (e.g., Cu(I) complexes) which dissociate by thermal disproportionation can be oxidized by the solvent (or some other oxidizing agent) during deposition. In such situations, providing a reducing agent in the solution can reduce the oxidized material, thereby mitigating contamination of the deposited film.

Various aspects of the invention will now be summarized.

In a first aspect, the invention features a method for reducing contamination of a layer of a material deposited onto a surface of a substrate, e.g., a patterned substrate, by: (i) selecting a precursor of the deposit material and a solvent, wherein the precursor dissociates under conditions at which the solvent is a supercritical or near-supercritical fluid; (ii) dissolving the precursor into the solvent to form a supercritical or near-supercritical solution; and (iii) exposing the substrate to the solution under conditions at which the precursor dissociates while maintaining supercritical or near-supercritical conditions, thereby forming the layer of the material on the surface of the substrate, wherein the layer includes at least 95 weight percent of the deposited material.

Embodiments of the method may include one or more of the following features, and/or features of other aspects The precursor can thermally dissociate (e.g., by thermal disproportionation). The temperature of the substrate can be maintained at more than 150° C. (e.g., more than 175, 200, 225° C.). The solvent can have a reduced temperature between 0.8 and 2.0. The solvent can have a density of at least 0.1 g/cm$^3$. The solvent can have a density of at least one third of its critical density. The solvent can have a critical temperature of less than 150° C.

The layer can include at least 98 weight percent of the deposited material. The material can be a metal or an alloy (e.g., copper). Contaminants of the layer can include an oxide of the metal (e.g., copper oxide).

The method can include providing a reaction reagent that reduces contamination of the material by reacting with a contaminant to form the material or to form a reaction product that is soluble in the solvent. The reaction reagent can be a reducing agent (e.g., hydrogen).

In some embodiments, the material is copper and the reaction reagent reduces the amount of copper oxide formed on the surface of the substrate. The precursor can include an organo-metallic complex (e.g., a Cu(I) complex or a Cu(II) complex). The precursor can include a ligand, and upon dissociation of the precursor the ligand provides a reaction reagent to the solution that reduces contamination of the material deposited on the surface of the substrate. The reaction reagent can reduce oxidation of the material deposited on the surface of the substrate.

In another aspect, the invention features a method for forming a layer of a material deposited onto a surface of a substrate by: (i) selecting a precursor, e.g., a Cu(I) complex, of the material and a solvent, e.g., $CO_2$, wherein the precursor dissociates under conditions at which the solvent is a supercritical or near-supercritical fluid; (ii) dissolving the precursor into the solvent to form a supercritical or near-supercritical solution; (iii) exposing the substrate to the solution under conditions at which the precursor dissociates and the material forms on the surface of the substrate while maintaining supercritical or near-supercritical conditions; and (iv) mixing a reaction reagent, e.g., a reducing reagent, into the solution, wherein the reaction reagent reduces contamination of the material.

Embodiments of the invention can include one or more of the following features, and/or features of other aspects. For example, the reaction reagent can reduce contamination of the material by reducing an oxide of the material to form the material. The deposited material can be a metal. In embodiments where the material is a metal, the reaction reagent can reduce contamination by reducing oxidation of the metal In another aspect, the invention features a method for forming an integrated circuit, including: (i) dissolving a precursor of a material into a solvent to form a supercritical or near-supercritical solution; (ii) exposing a substrate to the solution under conditions at which the precursor dissociates while maintaining supercritical or near-supercritical conditions, thereby depositing the material onto the surface of the substrate; and (iii) processing the substrate or material, or both, to create the integrated circuit.

Embodiments of the method can include one or more of the following feature, and/or features of other aspects.

The material can be a metal (e.g., copper) or an alloy.

The method can include providing a reaction reagent that reduces contamination of the material on the surface of the substrate. The reaction reagent can reduce oxidation of the material.

In a further aspect, the invention features an integrated circuit formed by one of the above methods, or a substrate coated with a film deposited by of the above methods.

As used herein, a "supercritical solution" (or solvent) is one in which the temperature and pressure of the solution (or solvent) are greater than the respective critical temperature and pressure of the solution (or solvent). A supercritical condition for a particular solution (or solvent) refers to a condition in which the temperature and pressure are both respectively greater than the critical temperature and critical pressure of the particular solution (or solvent).

A "near-supercritical solution" (or solvent) is one in which the reduced temperature (actual temperature measured in Kelvin divided by the critical temperature of the solution (or solvent) measured in Kelvin) and reduced pressure (actual pressure divided by critical pressure of the solution (or solvent)) of the solution (or solvent) are both greater than 0.8 but the solution (or solvent) is not a supercritical solution. A near-supercritical condition for a particular solution (or solvent) refers to a condition in which the reduced temperature and reduced pressure are both respectively greater than 0.8 but the condition is not supercritical. Under ambient conditions, the solvent can be a gas or liquid. The term solvent is also meant to include a mixture of two or more different individual solvents.

Unless otherwise defined, all technical and scientific terms used herein have the same meaning as commonly understood by one of ordinary skill in the art to which the invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intending to be limiting.

Other features and advantages of the invention will be apparent from the following detailed description, and from the claims.

DESCRIPTION OF DRAWINGS

Like reference symbols in the various drawings indicate like elements.

DETAILED DESCRIPTION

Figure 1:
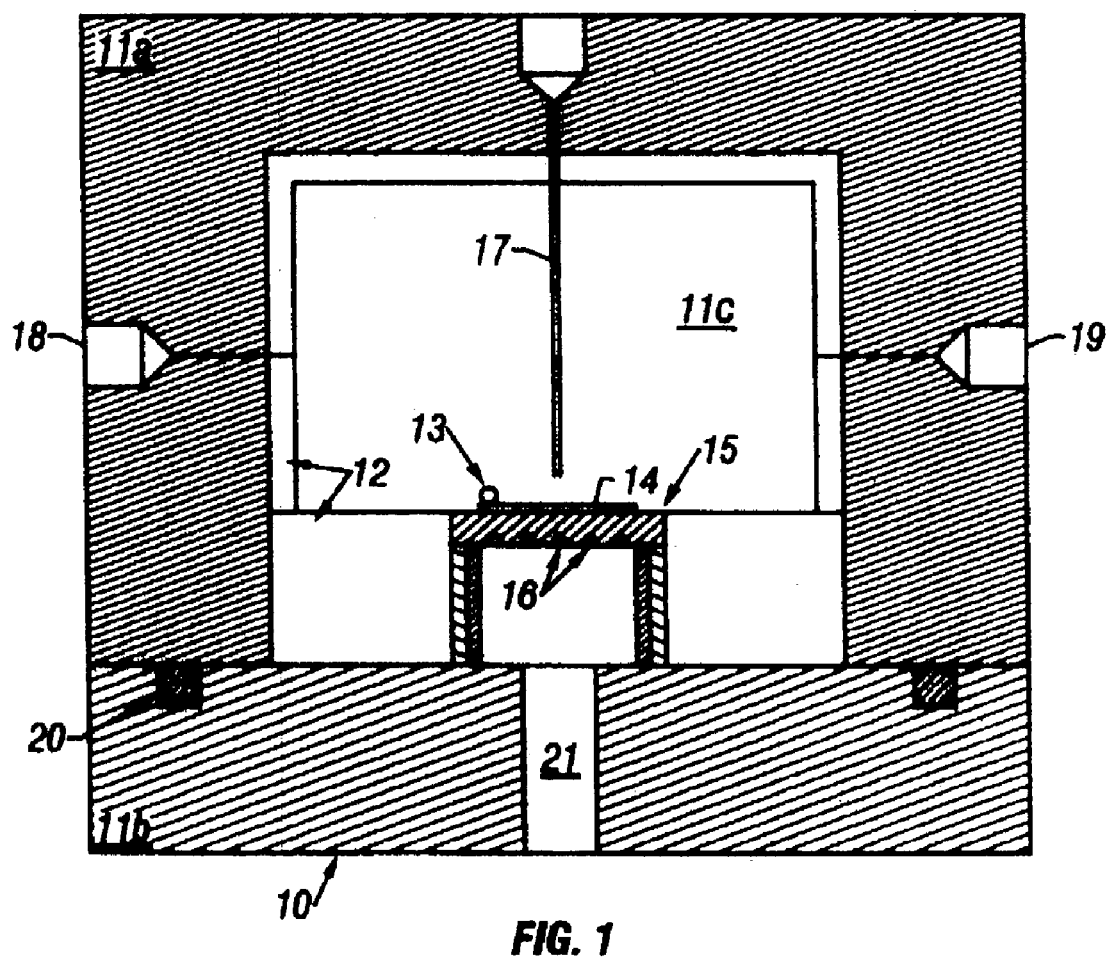
FIG. 1 is a schematic of a double flange, cold-wall reactor for use in certain of the methods described herein.

The invention is based on the discovery that contamination, e.g., oxidation, of material deposited onto a substrate surface or into a porous solid can be suppressed through the appropriate selection of the material precursor, delivery agent, e.g., solvent, and/or reaction conditions, e.g., temperature or presence of additional reagents. By using the new suppression methods, desired materials can be deposited onto a substrate as a high purity (e.g., better than 95, 97, or even 99%) metal or multicomponent metal mixture or alloy thin film (e.g., less than 10, 8, 5, or 3 microns), a conformal coating on a topologically complex surface, and as both a continuous and/or discreet deposit within a microporous support. The substrate can be, e.g., a metal, a semiconductor, or a polymer, can be patterned with a complex surface, and can include one or more previously formed layers or coatings. The supercritical fluid transports the precursor to the substrate surface where the reaction takes place and transports ligand-derived decomposition products away from the substrate thereby removing potential film impurities.

CFD can be used, for example, to deposit metal films, such as platinum (Pt) and palladium (Pd) films onto silicon wafers or fluoropolymer substrates. For example, CFD can be used as a process step in integrated circuit manufacture (e.g., for the deposition of copper electrode layers). Process temperatures of as low as 80° C. can be used with the new methods to provide a film purity that can be better than 99%. CFD can also be used for deposition of multicomponent alloy films, e.g., nickel/platinum (Ni/Pt) alloys of increasing Ni composition spanning the composition range between the two elements. The composition of the alloy is dictated by the stoichiometric ratio of the precursors in supercritical $CO_2$ solution. Furthermore, CFD can be used to provide complete conformal and uniform coverage of patterned substrates such as patterned silicon (Si) wafers having feature sizes as small as, e.g., 0.1 microns wide by 1.0 micron deep.

CFD can also be used to deposit materials into mesoporous or microporous inorganic solids. Examples include the metallization of nanometer-size pores in catalyst supports such as silicalites and amorphous mesoporous aluminosilicate molecular sieves. Supercritical fluids have gas-like transport properties (e.g., low viscosity and absence of surface tension) that ensure rapid penetration of the pores. Uniform deposition throughout the pores is further facilitated by independent control of the transport (via solution) and deposition (via reaction reagent) mechanisms in CFD. In addition, CFD can be used to prepare metal or metal alloy membranes formed within porous substrates such as alumina. In contrast, metallization of porous substrates by CVD rather than CFD often results in choking of the pores by rapid deposition at the pore mouth.

General Method

A batch CFD run in a "cold-wall" reactor involves the following general procedure.

Referring to FIG. 1, a reactor housing is made of a stainless steel top flange 11a, and a stainless steel bottom flange 11b connected to top flange, e.g., via bolts (not shown). The top and bottom flanges are sealed with an O-ring seal 20, e.g., a Buna rubber O-ring. The inside of the top flange 11a and the surface of the bottom flange 11b are both lined with a liner 12, e.g., a TEFLON liner, to create an internal chamber 11c. A heated substrate stage 15, which can be heated, e.g., by a nickel-chromium resistance heater 16 potted into the stage with potting cement, is arranged within this chamber 11c.

The substrate 14 to be coated is placed on stage 15. A thermocouple 13 located on the stage 15, and preferably contacting the substrate 14, is connected to a temperature controller through high pressure feed-through (wires not shown), and is used to monitor and control the temperature of the substrate. Reactor housing 10 also includes a line 17 (e.g., a high pressure line) for reactant feed, a first port 18 for rupture disk, feeds, outlets, thermocouples, pressure measurement, etc., and a second port 19 for rupture disk, feeds, outlets, thermocouples, pressure measurement, etc. In addition, the housing has a third port 21 for high pressure feed-through (wires not shown).

The temperature of the stage 15, and the substrate contacting the stage, is controlled by regulating power delivered to the heater using a temperature controller (e.g., PID controller). In a typical experiment, a single substrate 14 is placed onto stage 15, and a known mass of precursor (which can include precursor materials for multiple components) is placed into the reactor 10. The reactor is then heated to the desired temperature, typically 40–80° C., purged with nitrogen and filled with one or more solvents using a high-pressure manifold or a computer-controlled syringe pump, and the contents are brought to a specified temperature and pressure at which the solvent is a supercritical or near-supercritical solvent. The vessel is maintained at this condition (at which the precursor is unreactive) for a period of time, e.g., up to one hour or longer, sufficient to ensure that the precursor has completely dissolved. The substrate is then heated to a specific temperature, typically 150–250° C. on the stage, which is higher than the bulk temperature of the supercritical solvent/precursor mixture.

In some embodiments, the elevated temperature of the substrate initiates a chemical reaction involving the precursor, e.g., thermal disproportionation. The products of the chemical reaction typically include the material or an intermediate of the material. Alternatively, or additionally, a reaction reagent is transferred through a manifold connected to the reaction vessel. The reaction reagent can be a gas or a liquid, or a gas, liquid, or solid dissolved in a supercritical solvent. The transfer manifold is maintained at a pressure in excess of that of the reaction vessel. The mass of reaction reagent transferred into the reaction vessel is usually in molar excess relative to the precursor.

The reaction is typically carried out for at least one hour, although the reaction may be completed in much less than one hour, e.g., less than 30, 20, 10, or 5 minutes, or less than 180, 120, 60, or 30 seconds. The optimal length of reaction time can be determined empirically. When the reactor has cooled, the substrate is removed and can be analyzed. This method can be employed as a single-step deposition on an unseeded substrate or as a two-step method as described above, where a catalytic seed layer is first deposited on the substrate and a metal film of the same or different composition is deposited on the seeded substrate.

Solubility of the precursor at the reaction conditions can be verified in a variable volume view cell, which is well known in the art (e.g., McHugh et al, *Supercritical Fluid Extraction: Principles and Practice*; Butterworths, Boston, 1986). Known quantities of precursor and supercritical solvent are loaded into the view cell, where they are heated and compressed to conditions at which a single phase is detected e.g., optically. Pressure is then reduced isothermally in small increments until phase separation (either liquid-vapor or solid-vapor) is induced.

The temperature and pressure of the process depend on the reactants and choice of solvent. Generally, temperature is less than 350° C. (e.g., 300, 275, 250, 225, 200, 180, 160, 150, or 125° C.) and can be less than 100° C., while the pressure is typically between 50 and 500 bar (e.g., between 100 and 400, 100 to 150, or 150 to 250 bar). In embodiments where the precursor dissociates by thermal decomposition, the temperature should be sufficiently high to cause the precursor to dissociate. A temperature gradient between the substrate and solution can also be used to enhance chemical selectivity.

Alternative methods using a "hot-wall" reactor involve the following procedure. A single substrate and a known mass of precursor (which can include precursor materials for multiple components) are placed in a reaction vessel (e.g., a stainless steel pipe), which is sealed, purged with solvent, weighed, and immersed in a circulating controlled temperature bath (thereby heating the walls of the reactor). The vessel is then filled with solvent using a high-pressure transfer manifold. The contents of the reactor are mixed using a vortex mixer and conditions are brought to a specified temperature and pressure at which the solvent is a supercritical or near-super-critical solvent. The mass of solvent transferred into the reaction vessel is determined gravimetrically using standard techniques. The vessel is maintained at this condition (at which the precursor is unreactive) for a period of time, e.g., up to one hour or longer, sufficient to ensure that the precursor has completely dissolved and that the reaction vessel is in thermal equilibrium.

A reaction reagent is then transferred through a manifold connected to the reaction vessel. The reaction reagent can be a gas or a liquid, or a gas, liquid, or solid dissolved in a supercritical solvent. The transfer manifold is maintained at a pressure in excess of that of the reaction vessel. The mass of reaction reagent transferred into the reaction vessel is usually in molar excess relative to the precursor. The reaction is typically carried out for at least one hour, although the reaction may be completed in much less than one hour, e.g., less than 30, 20, 10, or 5 minutes, or less than 180, 120, 60 or 30 seconds. The optimal length of reaction time can be determined empirically. When the reactor has cooled, the substrate is removed and can be analyzed.

A continuous CFD process is similar to the above batch methods except that known concentrations of the supercritical (or near-supercritical) solution (and reaction reagent when required) are taken from separate reservoirs and continuously added to a reaction vessel containing multiple substrates as supercritical solution containing precursor decomposition products or unused reactants is continuously removed from the reaction vessel. The flow rates into and out of the reaction vessel are made equal so that the pressure within the reaction vessel remains substantially constant. The overall flow rate is optimized according to the particular reaction. Prior to introducing precursor-containing solution into the reaction vessel, the reaction vessel is filled with neat solvent (which is the same as the solvent in the precursor solution) at supercritical or near-supercritical pressures and is heated to supercritical or near-supercritical temperatures. As a result, supercritical or near-supercritical conditions are maintained as the precursor-containing solution is initially added to the reaction vessel.

A two-step method can be used in situations where a desired metal or metal alloy, such as copper, is not readily deposited on a substrate, especially a patterned substrate, using conventional plating techniques or even the CFD methods described herein. In these situations, a uniform seed layer, e.g., of clusters, is prepared from a material, such as Pd, Pt, or Cu, which can activate the substrate and serve as a catalytic site on which the desired metal or metal alloy call be deposited in the second step. The formation of seed layers is described in detail in published PCT Application WO 01/32951.

Variations of these methods, which apply in both the cold-wall and hot-wall reactors, include (i) deposition of the seed layer by CFD followed by metal deposition by other techniques including CVD or electroless or electrolytic plating; (ii) deposition of a seed layer using any technique including sputtering, CVD, electroless plating, thermolysis, or other reactions at the substrate surface followed by CFD; and (iii) deposition of both the seed layer and metal film by CFD; and sequential and/or simultaneous combinations of methods.

Precursors

Precursors are chosen so that they yield the desired material on the substrate surface following dissociation in the solvent under the reaction conditions (e.g., at an appropriate temperature and pressure). Materials can include metals (e.g., Cu, Pt, Pd, and Ti), elemental semiconductors (e.g., Si, Ge, and C), compound semiconductors (e.g., III–V semiconductors such as GaAs and InP, II–VI semiconductors such as CdS, and IV–VI semiconductors such as PbS), oxides (e.g., $SiO_2$ and $TiO_2$), or mixed metal or mixed metal oxides (e.g., a superconducting mixture such as Y—Ba—Cu—O). Organometallic compounds and metalloorganic complexes are an important source of metal-containing reagents and are particularly useful as precursors for CFD.

Some examples of useful precursors for CFD include metallo-organic complexes containing the following classes of ligands: beta-diketonates (e.g., $Cu(hfac)_2$ or $Pd(hfac)_2$, where hfac is an abbreviation for 1,1,1,5,5,5-hexafluoroacetylacetonate), $Cu(tmhd)_2$, where tmhd is an abbreviation for tetramethylheptanedionate, alkyls (e.g., $Zn(ethyl)_2$ or dimethylcyclooctadiene platinum ($CODPtMe_2$)), allyls (e.g. bis(allyl)zinc or $W(\eta^4\text{-allyl})_4$), dienes (e.g., $CODPtMe_2$), or metallocenes (e.g., $Ti(\eta^5\text{-}C_5H_5)_2$ or $Ni(\eta^5\text{-}C_5H_5)_2$). For a list of additional potential precursors see, for example, M. J. Hampden-Smith and T. T. Kodas, *Chem. Vap. Deposition,* 1:8 (1995).

Precursor selection for CVD is limited to organometallic compounds that exhibit high vapor pressure at temperatures below their thermal decomposition temperature. This limits the number of potential precursors. On the other hand, CFD obviates the requirement of precursor volatility and replaces it with a much less demanding requirement of precursor solubility in a supercritical fluid.

Low process temperatures (e.g., less than 350, 300, 275, 250, 225, 200, 150, or 100° C.) and relatively high fluid densities (e.g., greater than 0.1 to 0.2 $g/cm^3$) in the vicinity of the substrate are important features of CFD. If the substrate temperature is too high, the density of the fluid in the vicinity of the substrate approaches the density of a gas, and the benefits of the solution-based process are lost. In addition, a high substrate temperature can promote deleterious fragmentation and other side-reactions that lead to film contamination.

Chemical selectivity at the substrate can be enhanced by a temperature gradient established between the substrate and the supercritical solution. For example, a gradient of 40° C. to 250° C. or 80° C. to 150° C. can be beneficial. However, to maintain the benefits of CFD, the temperature of the substrate measured in Kelvin divided by the average temperature of the supercritical solution measured in Kelvin is typically between 0.8 and 2.0, e.g., between 0.8 and 1.7, or between 0.8 and 1.5.

In preferred embodiments, metal precursors are selected which undergo thermal disproportionation at conditions (e.g., temperature and pressure) under which the solvent in which they are dissolved is super-critical or near-supercritical, thereby depositing high-purity metal films (e.g., with minimal oxide contamination). For example, deposited films can be at least 95 weight percent metal (e.g., more than 96, 97, 98, 99 weight percent). However, in many cases where an oxidizing agent is present during precursor disproportionation (e.g., where the solvent includes an oxidizing agent), the deposited metal can be contaminated by oxidation to form a metal oxide unless a reducing agent is present during deposition. Where a reducing agent is provided, such precursors can deposit high-purity metal films with minimal metal oxide contamination. Where the metal is copper, examples of precursors include Cu(I) compounds such as (β-diketonate)CuL compounds where L is a ligand that can include alkynes, phosphines, olefins, cyclooctadiene, and vinyl trimethysilane. Other examples of Cu(I) precursors include Cu(hfac)(L), where hfac is 1,1,1,5,5,5-hexafluoro-2,4-pentanedionato, and L can be 2-butyne, COD, VTMS, or 2-methyl-1-hexene-3-yne. So-called self-reducible precursors can also be used to deposit Cu.

In some embodiments, the precursor possesses ligands that can serve as, or liberate, reducing agents, such as $H_2$, upon decomposition of the precursor. Self-reducing precursors include, but are not limited to, partially fluorinated β-aminoalcoholate complexes such as $Cu[OC(CF_3)_2CH_2NHCH_2CH_2OMe]_2$ (see, e.g., Hsu et al., *Chem. Vap. Deposition* 2001, 7, No. 1, pp. 28–31).

In some cases, the supercritical fluid can participate favorably in the reaction. In other words, the supercritical fluid can react with the precursor or a derivative of the precursor to deposit the desired material on the substrate surface. For example, in a supercritical solution including $N_2O$ as a solvent and metal precursors such as organometallic compounds, $N_2O$ can serve as an oxidizing agent for the metal precursors yielding metal oxides as the desired material. In many cases, however, the solvent in the supercritical fluid is chemically inert.

Solvents

Solvents useful as supercritical fluids are well known in the art and are sometimes referred to as dense gases (Sonntag et al., *Introduction to Thermodynamics, Classical and Statistical,* 2nd ed., John Wiley & Sons, 1982, p. 40). At temperatures and pressures above certain values for a particular substance (defined as the critical temperature and critical pressure, respectively), saturated liquid and saturated vapor states are identical and the substance is referred to as a supercritical fluid. Solvents that are supercritical fluids are less viscous than liquid solvents by one to two orders of magnitude. In CFD, the low viscosity of the supercritical solvent facilitates improved transport (relative to liquid solvents) of reagent to, and decomposition products away, from the incipient film. Furthermore, many reagents that would be useful in chemical vapor deposition are insoluble or only slightly soluble in various liquids and gases and thus cannot be used in standard CVD. However, the same reagents often exhibit increased solubility in supercritical solvents. Generally, a supercritical solvent can be composed of a single solvent or a mixture of solvents, including, for example, a small amount (<5 mol %) of a polar liquid co-solvent such as methanol.

It is important that the reagents are sufficiently soluble in the supercritical solvent to allow homogeneous transport of the reagents. Solubility in a supercritical solvent is generally proportional to the density of the supercritical solvent. Ideal conditions for CFD include a supercritical solvent density of at least 0.1 to 0.2 $g/cm^3$ or a density that is at least one third of the critical density (the density of the fluid at the critical temperature and critical pressure).

Table 1 below lists some examples of solvents along with their respective critical properties. These solvents can be used by themselves or in conjunction with other solvents to form the supercritical solvent in CFD. Table 1 lists the critical temperature, critical pressure, critical volume, molecular weight, and critical density for each of the solvents.

TABLE 1

Critical Properties of Selected Solvents

| Solvent | $T_c$ (K) | $P_c$ (atm) | $V_c$ (cm/mol) | Molecular Weight | $\rho_c$ (g/cm$^3$) |
|---|---|---|---|---|---|
| $CO_2$ | 304.2 | 72.8 | 94.0 | 44.01 | 0.47 |
| $C_2H_6$ | 305.4 | 48.2 | 148 | 30.07 | 0.20 |
| $C_3H_8$ | 369.8 | 41.9 | 203 | 44.10 | 0.22 |
| $n\text{-}C_4H_{10}$ | 425.2 | 37.5 | 255 | 58.12 | 0.23 |
| $n\text{-}C_5H_{12}$ | 469.6 | 33.3 | 304 | 72.15 | 0.24 |
| $CH_3\text{—}O\text{—}CH_3$ | 400 | 53.0 | 178 | 46.07 | 0.26 |
| $CH_3CH_2OH$ | 516.2 | 63.0 | 167 | 46.07 | 0.28 |
| $H_2O$ | 647.3 | 12.8 | 65.0 | 18.02 | 0.33 |
| $C_2F_6$ | 292.8 | 30.4 | 22.4 | 138.01 | 0.61 |

To describe conditions for different supercritical solvents, the terms "reduced temperature," "reduced pressure," and "reduced density" are used. Reduced temperature, with respect to a particular solvent, is temperature (measured in Kelvin) divided by the critical temperature (measured in Kelvin) of the particular solvent, with analogous definitions for pressure and density. For example, at 333 K and 150 atm, the density of $CO_2$ is 0.60 g/cm$^3$; therefore, with respect to $CO_2$, the reduced temperature is 1.09, the reduced pressure is 2.06, and the reduced density is 1.28. Many of the properties of supercritical solvents are also exhibited by near-supercritical solvents, which refers to solvents having a reduced temperature and a reduced pressure both greater than 0.8, but not both greater than 1 (in which case the solvent would be supercritical). One set of suitable conditions for CFD include a reduced temperature of the supercritical or near-supercritical solvent of between 0.8 and 1.6 and a critical temperature of the fluid of less than 150° C.

Carbon dioxide ($CO_2$) is a particularly good choice of solvent for CFD. Its critical temperature (31.1° C.) is close to ambient temperature and thus allows the use of moderate process temperatures (<80° C.). It is also unreactive with most precursors used in CVD and is an ideal medium for running reactions between gases and soluble liquids or solid substrates. Other suitable solvents include, for example, ethane or propane, which may be more suitable than $CO_2$ in certain situations, e.g., when using precursors which can react with $CO_2$, such as complexes of low-valence metals containing strong electron-donating ligands (e.g., phosphines).

In some embodiments, solvents can be selected based on their inertness with respect to the precursor and/or substrate. Alternatively, solvents can be selected to advantageously participate in the deposition reaction. Examples of such solvents are described herein.

Contamination Suppression

Film contamination, e.g., by oxidation or the inclusion of other impurities, such as organic compounds, can adversely affect many of the properties of the film. For example, contamination of copper (Cu) films by oxidation can significantly increase the resistivity of the films. Such contamination is often detrimental to the function of the film. Contamination can be suppressed by careful selection of the precursor, solvent, and reaction environment, e.g., temperature. Contamination can also be suppressed by including additional reagents in the CFD process. In the description that follows, the suppression of oxidation in Cu films by several different mechanisms is discussed. It will be understood that Cu oxidation is intended only as an example of film contamination, and the concepts disclosed herein can be applied to mitigate contamination in many CFD systems. Moreover, in some embodiments, the desired deposit material can be an oxide (e.g., copper oxide), in which case contamination would include non-oxidized material (e.g., copper). In such embodiments, one could include an oxidizing agent to promote oxidation and reduce the amount of non-oxidized material.

Copper is used in technologically important applications, including interconnect structures and for filling contact and via holes in microelectronic devices. The advantages of copper over other conducting materials, such as aluminum, include lower resistivity, improved electromigration resistance, and increased resistance to stress-induced voidage. Current methods of depositing copper, such as CVD and sputtering, have not been shown to provide uniform filling of very narrow (~150 nm and less), high aspect ratio trenches or vias. As a result, copper CVD has not been practiced commercially for these applications. Other applications for copper include printed wiring boards.

Cu precursors, include, but are not limited to, Cu(II) beta diketonates such as Cu(hfac)$_2$, Cu(hfac)$_2$ hydrate, bis(6,6,7,7,8,8,8-heptafluoro-2,2-dimethyl-3-5-octanedionate)copper (II), bis(2,2,6,6,-tetramethyl-3,5-heptanedionato)copper(II), Copper (II) acetylacetonate, and partially fluorinated B-aminoaloholate complexes such as Cu(II)[OC(CF$_3$)$_2$CH$_2$NH CH$_2$CH$_2$OMe]$_2$. Cu(I) precursors, include, but are not limited to, (β-diketonate)CuL compounds, where L is a ligand that can include alkynes, phosphites, olefins, cyclooctadiene, and vinyl trimethysilane (VTMS). Examples of Cu(I) precursors include Cu(hfac)(L), where hfac is 1,1,1,5,5,5-hexafluoro-2,4-pentanedionato, and L can be 2-butyne, COD, VTMS, or 2-methyl-1-hexene-3-yne. Cu films can be deposited onto a variety of substrates, e.g., silicon, metals, glasses, polyimides, various oxides such as silicon oxides, and nitrides such as titanium nitrides.

There are several potential sources of oxidation that can cause contamination of Cu films during CFD. In some cases, oxidation of the film can take place when the film comes in contact with ambient oxygen, e.g., on exposure to air. Alternatively, or additionally, oxidation can be caused by interaction of the film with decomposition by-products that may contain oxygen. For example, at sufficiently high temperatures and/or in the absence of certain reagents, e.g., hydrogen, the breaking of precursor ligands can take place:

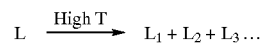

originating species L$_1$, L$_2$, L$_3$, . . . , which can then react with Cu:

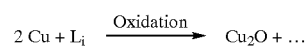

In some embodiments, chemical reactions with the solvent (or impurities in the solvent) can contaminate the film. For example, it is possible that scCO$_2$ can oxidize copper under the appropriate conditions, e.g., at high temperature (such as 200° C. or higher). Trace impurities, such as water and O$_2$, in the supercritical solvent can lead to extensive oxidation of Cu at high temperature.

In some cases, the film's susceptibility to contamination can be influenced by the morphology, e.g., grain size, of the deposit. The grain size of a Cu film, for example, can affect the films susceptibility to oxidation. In general, films with larger, e.g., micron or larger, grains are believed to be less susceptible to oxidation than films with smaller, e.g., nanometer, grains. Grain size depends on numerous factors. For example, grain size can depend on reaction temperature. Films formed at higher temperatures typically form larger grains than films formed under similar conditions but at lower temperatures. The reaction mechanism can also affect film morphology. Films produced by the hydrogenation and disproportionation reactions of Cu(I) precursors may result in a different morphology from films produced under similar conditions from Cu(II) precursors.

Reaction conditions can also affect the susceptibility of a material to contamination. Reaction temperature, for example, can affect material contamination. As mentioned above, grain size can be affected by the reaction temperature. Additionally, the degree of oxidation may be affected by temperature. Cu films formed by CFD of (hfac)Cu(I)L$_n$ in C$_2$F$_6$, for example, show substantially more oxidation when formed at higher temperatures, e.g., 250° C., than films formed at slighter lower temperatures, e.g., 225° C.

Oxidation of Cu films can often be suppressed by providing a reducing agent during CFD. In some embodiments, an additional reducing reagent, e.g., provided as a reducing atmosphere or in solution, can suppress oxidation of the Cu film. Hydrogen, for example, is a strong reducing agent that is compatible with $scCO_2$, and is thus an ideal reducing agent for CFD. Ethanol or other alcohols can also serve as a reducing agent. Usually, any reagent that can reduce copper oxides to metallic copper, is inert with metallic copper at the reaction conditions, and is soluble in the supercritical or near supercritical fluid solvent can be used.

In many cases, the reducing agent suppresses oxidation of the film by directly reducing the precursor. The material, Cu, is deposited onto the substrate as a result of reduction of the precursor:

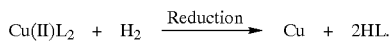

Here, $Cu(II)L_2$ is a Cu(II) complex with ligands, L. Examples of such precursors are given above. Alternatively, the reducing atmosphere can suppress oxidation by reducing a reaction product of the precursor. Again, the material, Cu, is deposited onto the substrate as a result of reduction, but this time reduction of a reaction product, such as in

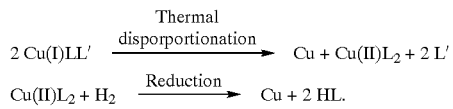

Here, a Cu(I) complex with neutral ligands L and L' dissociates through thermal disproportionation to form copper, a Cu(II) complex with ligands L, and a further reaction product L'. The newly formed Cu(II) complex is then reduced by the hydrogen atmosphere in a reduction reaction similar to the one described above. In the presence of an oxidizing environment (e.g., a $CO_2$ solution), the reaction products after thermal disproportionation can include copper oxide. Reaction with a reducing agent (e.g., $H_2$) can also reduce the copper oxide to copper, resulting in a high purity copper deposit.

For example, one embodiment of deposition in a cold-wall or hot-wall reactor includes multiple reactions from Cu(I) precursors of the general type ($\beta$-diketonate)$CuL_n$, where L is a Lewis base, and n is 1 or 2. A precursor, or mixture of precursors of this type, are dissolved in $CO_2$ as described above. The temperature of the substrate is then increased to initiate a thermal disproportionation reaction that yields a copper deposit according to the following reaction:

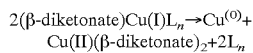

The addition of a reaction reagent then reduces the Cu(II)($\beta$-diketonate)$_2$ resulting in the deposition of additional copper. These reactions can be conducted sequentially or simultaneously.

In one embodiment, the precursor is Cu(I)(hexafluoroacetyl-acetonate)(2-butyne) (Cu(hfac)(2-butyne)), and the deposition from Cu(hfac)(2-butyne) occurs via a two-step reaction. The first step is shown below and occurs via a disproportionation reaction. This reaction does not require hydrogen and is thermally induced. At sufficiently high temperature, the reaction is nonselective, i.e., deposition occurs on all surfaces, whether or not seeded, and whether or not metallic. The disproportionation reaction deposits a layer of copper on any surface, including metals, metal oxides, nitrides, glasses, and polymers.

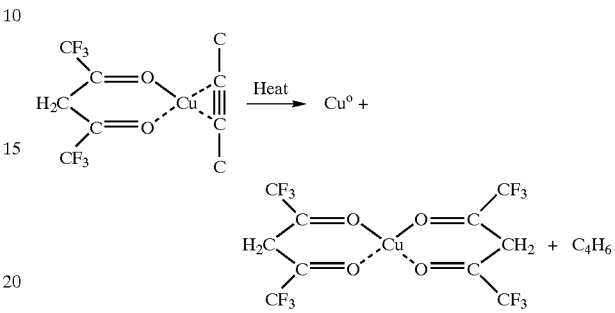

The second step is the reduction of the Cu(hfac)$_2$ formed during the disproportionation reaction, which occurs via a hydrogen reduction. The reaction occurs preferentially on an active metallic surface such as nickel, palladium, platinum, aluminum, copper, etc., such that the reduction of the Cu(hfac)$_2$ can then occur on the initial layer deposited thermally.

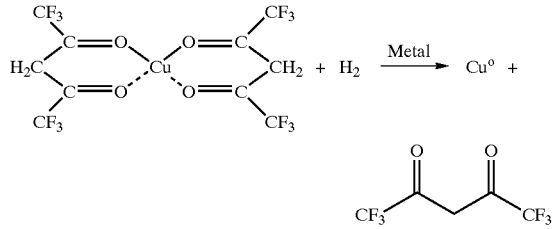

To suppress contamination of the film, a preferred embodiment is to maintain the temperature of the reactor and substrate at conditions that avoid thermal degradation of the liberated ligands and ligand products. For example it is known in the art that use of excessive reaction temperatures (greater than ~500K) for deposition of Cu from Cu(II)($\beta$-diketonate)$_2$ compounds can lead to the formation of carbon impurities by thermal decomposition of the ligand and ligand decomposition intermediates.

The appropriate choice of solvent can also suppresses contamination of the film. For example, in embodiments where the deposited material is susceptible to contamination by oxidation, a solvent that is a reducing agent can mitigate such contamination. An illustrative example of this is the thermal disproportionation reaction of (hfac)Cu(I)(2-butyne) in a $scCF_3H$ solvent, which yields almost pure Cu films. Comparatively, the thermal disproportionation reaction of (hfac)Cu(I)(2-butyne) in $scCO_2$ yields substantially oxidized films.

A solvent can suppress contamination in one or more ways. Replacing an oxidizing solvent, e.g., $CO_2$, with a non-oxidizing solvent, e.g., $CF_3H$, can suppress oxidation of a film. In some embodiments, the solvent can potentially suppress oxidation of the final film by reducing any $Cu_2O$ formed during CFD.

Alternatively, or additionally, the solvent can extract by-products of CFD, which would otherwise contaminate the film. By-product extraction can depend on the solubility of the reaction by-product in the solvent. The higher the solubility of a by-product in the solvent, the less chance the solvent will be deposited with, and thereby contaminate, the film. Selection of a polar solvent can enhance extraction efficiency of by-products by the solvent by increasing the solubility of the by-product in the solvent.

In some embodiments, the precursor ligand(s) can suppress contamination of the deposition material. Oxidation of Cu, for example, can be suppressed by selecting a precursor including an antioxidant and/or reducing ligand (e.g., a self-reducible precursor). The ligands of such precursors can participate in the deposition reaction (or reaction sequence) to prevent oxidation of the Cu and/or to reduce any $CuO_2$ that may form. As described earlier herein, self-reducible precursors possess ligands that can serve as, or liberate, reducing agents upon decomposition. Examples of a self-reducing precursor are partially fluorinated B-aminoalcoholate complexes such as $Cu[OC(CF_3)_2CH_2NHCH_2CH_2OMe]_2$.

In some embodiments, reagents can be included to mitigate contamination of the reactor and/or to expedite reactor cleanup. This can provide an economic benefit by reducing the degree of purification required for the supercritical or near-supercritical solvent, e.g., solvents with trace quantities of water or oxygen could be used to deposit contaminant free films, reducing down time between batch runs, or by increasing the length of time between maintenance in a continuous production facility.

In summary, contamination can be suppressed through careful selection of the precursor, the solvent, and the reaction conditions. In embodiments where the precursor dissociates through thermal disproportionation, for example, the precursor and solvent should be selected so that the solvent is supercritical or near-supercritical for a range of temperatures and pressures at which the precursor dissociates.

The precursor should be selected to deposit the appropriate material. Preferably, precursor decomposition products (other than the material) should be substantially inert with respect to other system components, or, where not inert, should not react to deposit contaminants (e.g., the reaction products should preferably be soluble in the solvent). Where the material is susceptible to contamination by reacting with other components of the system (e.g., with the solvent, or with other compounds that might be present, such as water), the precursor can be selected to include a decomposition product that mitigates contamination by inhibiting or reversing the undesirable reaction. An example of this is selecting a copper precursor that includes a reducing agent to mitigate oxidation of the copper.

Preferably, the solvent should be selected to be inert with the deposited material. In some embodiments, a reactive solvent can be selected that mitigates contamination, e.g., by reacting with contaminants or inhibiting the formation of contaminants. An example of a solvent that reacts with contaminants is a solvent that is a reducing agent, which reduces contaminating metal oxide to metal. Ease of use is another important factor to consider in solvent selection. For example, $CO_2$ is widely available, non-toxic, and forms a supercritical or near-supercritical fluid at practical temperatures and pressures. Accordingly, despite its oxidizing nature, which can lead to contamination of metal deposits, $CO_2$'s ease of use makes it a desirable solvent for many systems.

In addition to the precursor and solvent, one can select reaction reagents to mitigate contamination of the deposit material. For example, where the material is susceptible to contamination by oxidation, the addition of a reducing agent can suppress contamination by reducing any oxidized material.

EXAMPLES

Chemicals

Cu(I) hexafluoroacetylacetonate 2-butyne [(hfac)Cu$^I$(2-butyne)], Cu(I) hexafluoroacetylacetonate 1,5-cyclooctadiene [(hfac)Cu(COD)] and Cu(I) hexafluoroacetylacetonate vinyltrimethylsilane (VTMS) complex—Cu(II) Bis (hexafluoroacetylacetonate) [(hfac)Cu(VTMS)] were obtained from Gelest, Inc. Cu(I) hexafluoroacetylacetonate 2-methyl-1-hexene-3-yne was obtained from ADCS Inc. All chemicals were used as obtained without further purification. Carbon dioxide (Coleman grade, 99.99+% purity), Hexafluoroethane (99.95+% purity) and ultra high purity Hydrogen (99.999+%) were obtained from Merrian-Grave and used as received. Fluoroform (98+%) was obtained from Aldrich and used as received.

Example 1

Batch Cu Deposition of [(hfac)Cu$^I$(2-butyne)/$CO_2$ Solutions with Hydrogen

A 2.15 cm×2.2 cm silicon substrate with a 300 Å TiN barrier layer was sonicated first in toluene and then in acetone and dried in a convective oven. The experiment was conducted using a ≈85 ml stainless-steel high-pressure cold-wall reactor previously described (J. M. Blackburn, D. P. Long, A. Cabanas, J. J. Watkins, *Science* 294, 141 2001.) in batch mode. The cold wall reactor was a two-flanged high-pressure vessel with an electrically heated stage. The test wafer was secured to the heated stage. 0.2310 g of (hfac) Cu$^I$(2-butyne) was loaded into the reactor inside a globe box and the vessel was sealed and purged with $N_2$. The temperature of the walls and the stage were controlled independently. First, the reactor walls were heated to 60° C. using cartridge heaters. $CO_2$ was then loaded from a high-pressure syringe pump (ISCO Inc.), which was kept at the same temperature as the reactor walls, at pressure of 124 bar. The amount of $CO_2$ transferred was approximately 39 g at these conditions resulting in 0.60 weight % concentration of (hfac)Cu$^I$(2-butyne) in $CO_2$. The reactor was held at these conditions for approximately 30 minutes to ensures (hfac) Cu$^I$(2-butyne) was dissolved in $CO_2$. Prior to the experiment, the solubility of (hfac)Cu$^I$(2-butyne) in $CO_2$ at the concentration and conditions used in this experiment was confirmed using a view cell (M. A. McHugh and V. J. Krukonis, *Supercritical Fluid Extraction: Principles and Practice*, Butterworths, Boston, 1986). The pedestal was then heated to 225° C., while maintaining the reactor walls at 60° C. When the temperature of the stage reached 225° C., approximately 7 bar of $H_2$ was added to the reactor from a 70 ml manifold via pressure-drop. This corresponds to a $H_2$ to precursor molar ratio of 27:1. The final pressure in the vessel was 214 bar. Deposition of Cu was selective for the heated substrate over the reactor walls. The stage was held at 225° C. for 1½ hours. After the deposition, the reactor was allowed to cool down and the effluent was vented through an activated carbon bed. The deposition rendered a bright copper-colored film. The weight gain of the wafer was ≈2.6 mg.

The deposit was characterized by X-ray Diffraction (XRD). FIG. 2A shows the XRD diffraction pattern of the sample, which contains peaks due to Cu and the substrate. Peaks at 2Θ values of ≈33 and 69.3 correspond to the (200) and (400) planes of Si.

Figure 3:
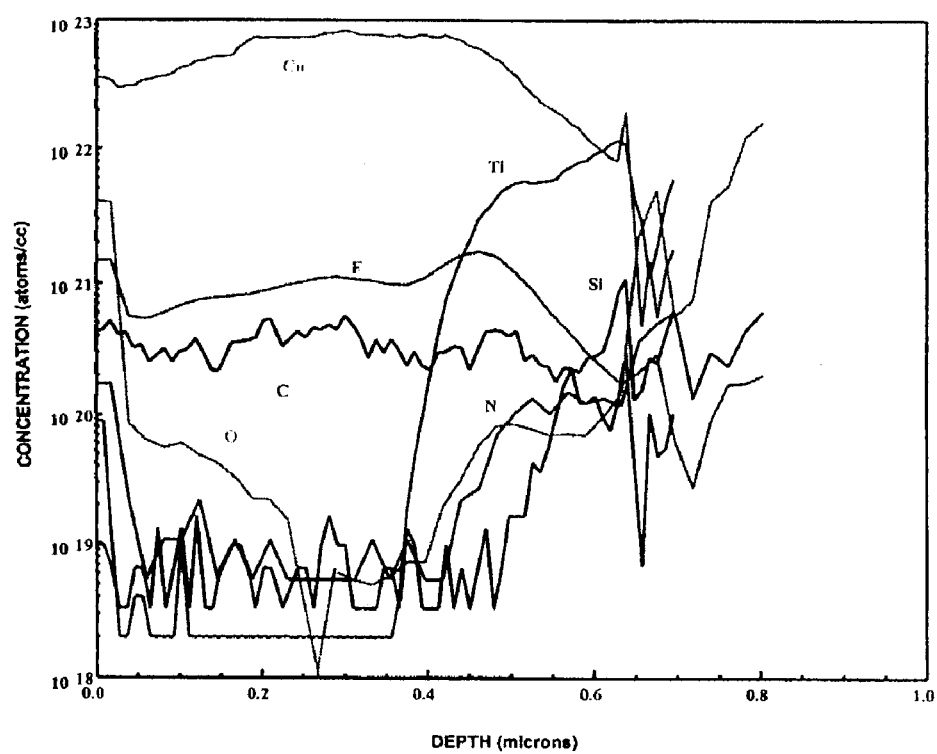
FIG. 3 is a secondary ion mass spectrometry (SIMS) analysis of film deposited in Example 1 using (hfac)CuI(2-butyne)/$CO_2$ solution and adding $H_2$.

FIG. 3 shows SIMS analysis of the film deposited in Example 1. The data indicate F contamination is on the order of 2 wt % whereas C and O concentrations are less than 0.5 wt %.

Example 2

Figure 2:
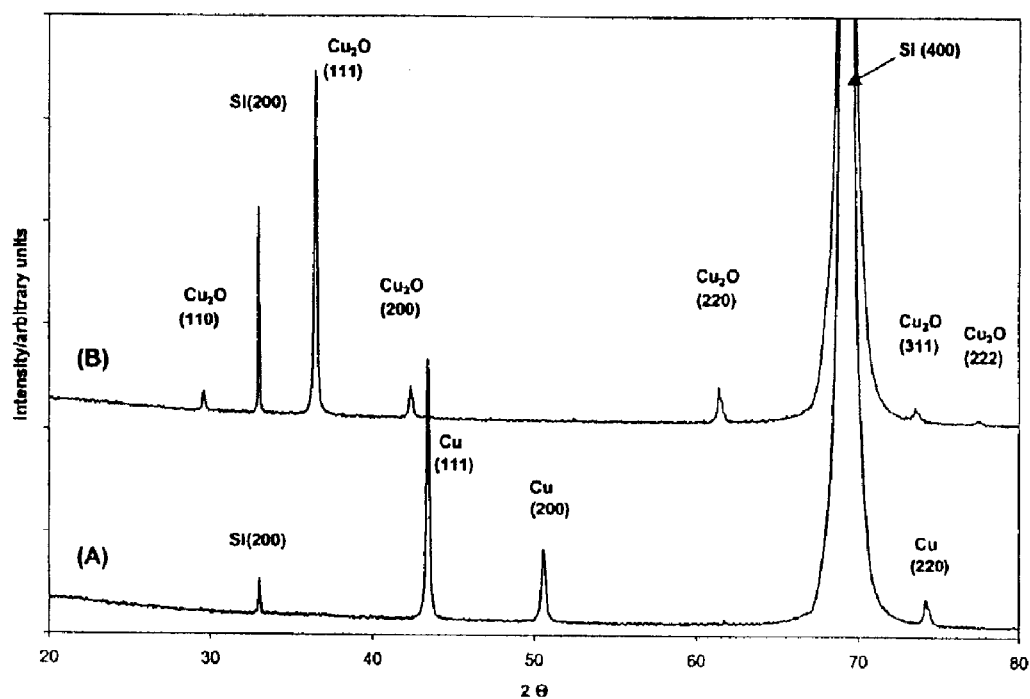
FIG. 2 is an X-ray diffraction (XRD) pattern of films deposited from (hfac)CuI(2-butyne)/$CO_2$ solutions: (A) Example 1, adding $H_2$ and (B) Example 2, without $H_2$.

Batch Cu Deposition of [(hfac)Cu$^I$(2-butyne)/CO$_2$ Solutions without Hydrogen Example 2 is a similar to Example 1, except that in this case H$_2$ was not added to the reactor. The size of the TiN(Si) substrate was 1.2 cm×2 cm. The amount of (hfac)Cu$^I$(2-butyne) used in this experiment was 0.2354 g. The reactor was loaded with CO$_2$ at 60° C. to a pressure of 124 bar. The concentration of (hfac)Cu$^I$(2-butyne) in CO$_2$ was 0.69% by weight. During deposition, the temperature of the walls was kept at 60° C. whilst pedestal was heated for 1½ hours at 225° C. Final pressure of the vessel was 207 bar. Thermal disproportionation of the (hfac)Cu$^I$(2-butyne)/CO$_2$ solution on a TiN(Si) wafer at 225° C. in absence of H$_2$ yielded a dark brown-black film. XRD of the film obtained from a (hfac)Cu$^I$(2-butyne)/CO$_2$ solution in absence of H$_2$ is shown in FIG. 2B. The analysis revealed the presence of a Cu$_2$O film. No Cu reflections were observed. Si peaks were also observed. Similar results were also obtained on bare Si substrates without a barrier layer. From FIG. 2 is evident that pure metallic Cu can not be deposited from the thermal reaction of (hfac)Cu$^I$(2-butyne) in CO$_2$ at these conditions unless H$_2$ is added to the system.

Figure 4:
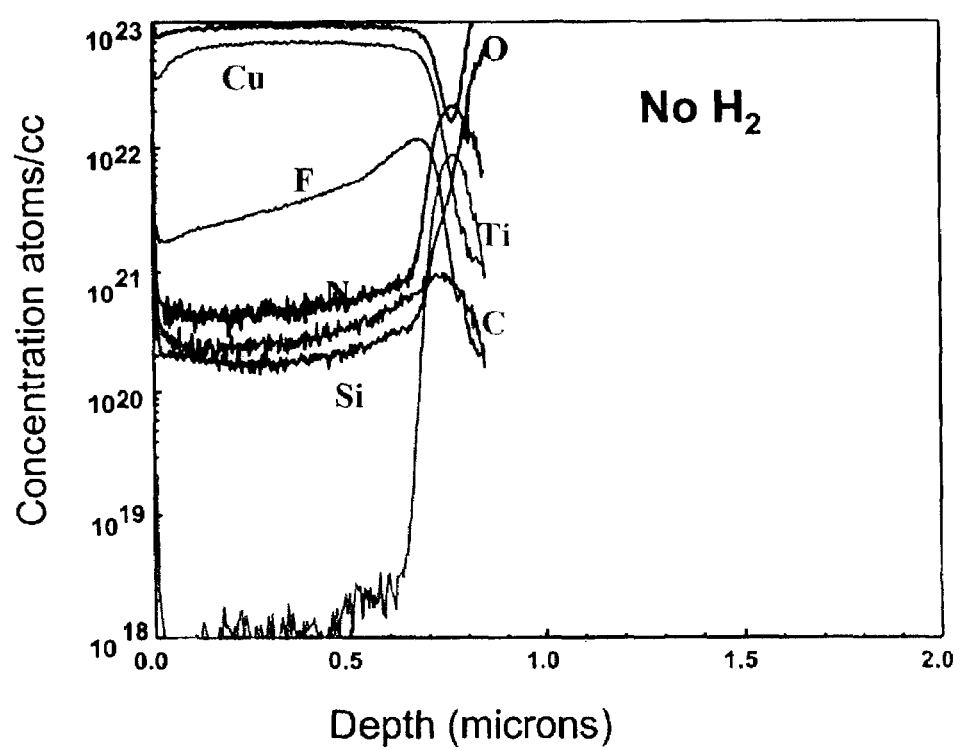
FIG. 4 is a SIMS analysis of the film deposited in Example 2 using (hfac)CuI(2-butyne)/$CO_2$ solution without $H_2$.

FIG. 4 show SIMS analysis of the film deposited in Example 2. SIMS analysis reveals a strong oxidation of the film deposited in the absence of H$_2$. F contamination is between 6 and 8 wt %, which is much higher than in film obtained in Example 1. C contamination of the film is however less than 0.5 wt %.

Example 3

Batch Cu Deposition of (hfac)Cu$^I$(COD)/CO$_2$ Solutions with Hydrogen

A 2.1 cm×2.2 cm silicon substrate with a 300 Å TiN barrier layer was sonicated first in toluene and then in acetone and dried in a convective oven. The experiment was conducted using the stainless-steel high-pressure cold-wall reactor and procedure described in Example 1. 0.2424 g of (hfac)Cu$^I$(COD) was loaded into the reactor and the vessel was sealed and purged with N$_2$. Then, the reactor walls were heated at 60° C. by heating cartridges and CO$_2$ was loaded from a high-pressure syringe pump (ISCO, Inc.) at 60° C. and 124 bar with 35 g of CO$_2$. The concentration of (hfac)Cu$^I$(COD) in CO$_2$ was 0.70 weight %. (hfac)Cu$^I$(COD) was allowed to dissolve in CO$_2$ within the reactor for approximately 30 minutes. Afterwards, the pedestal was heated resistively to 225° C., while keeping the walls at 60° C. When the temperature of the stage reached 225° C., ≈7 bar of H$_2$ were added to the reactor from a 70 ml manifold via pressure-drop. This corresponds to a H$_2$ to precursor molar ration of approximately 30:1. The final pressure in the vessel was 214 bar. By keeping the walls at a temperature lower than the stage, selective deposition onto the heated substrate was achieved. The stage was held at 225° C. for 1½ hours. After the deposition experiments, the reactor was allowed to cool down and the effluent was vented through an activated carbon bed. The deposition rendered a bright reddish film. The weight gain of the wafer was of almost 4 mg.

Figure 5:
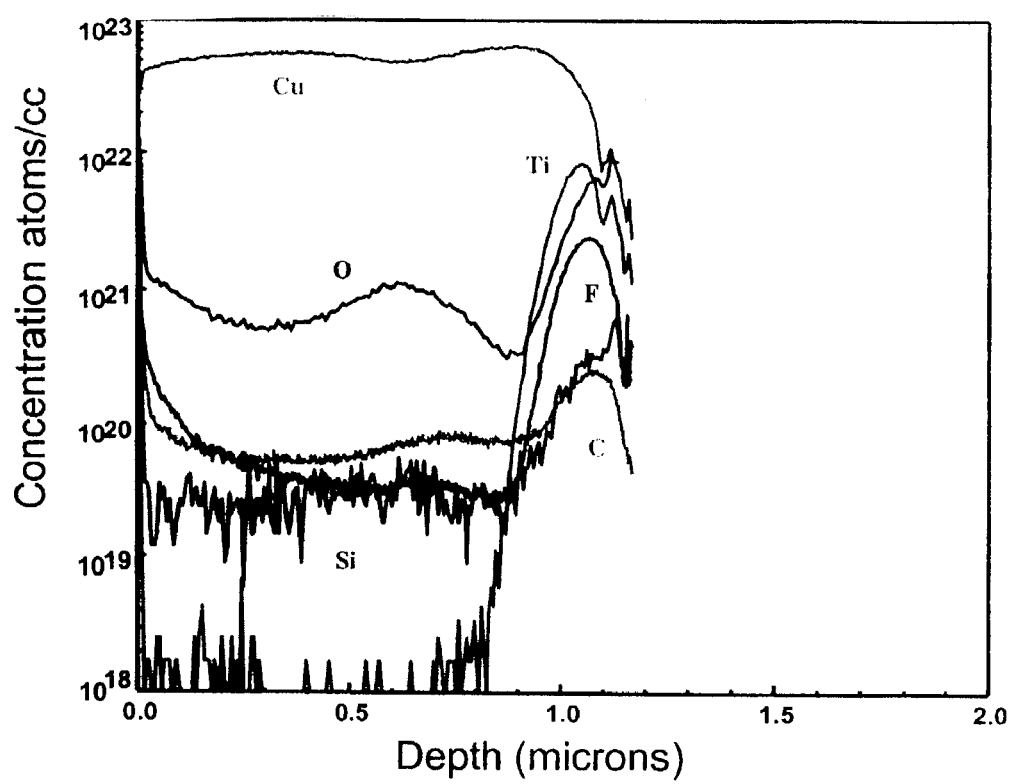
FIG. 5 is a SIMS analysis of a film deposited in Example 3 using (hfac)CuI(COD)/$CO_2$ solution with $H_2$.

FIG. 5 shows SIMS analysis of film deposited in Example 3 showing very low C and F contamination of the film (0.2 and 0.1 wt % respectively) in the bulk of the film. O content is around 1 wt %.

Example 4

Batch Cu Deposition of (hfac)Cu$^I$(COD)/CO$_2$ Solutions without Hydrogen

Example 4 is similar to Example 3, except that in this case H$_2$ was not added to the reactor. The size of the TiN(Si) substrate was 2.2 cm×2 cm. The amount of (hfac)Cu$^I$(COD) used in this experiment was 0.2201 g. The reactor was loaded with CO$_2$ at 60° C. and 124 bar with ≈43 g of CO$_2$. The concentration of (hfac)Cu$^I$(COD) in CO$_2$ was 0.51 weight %. The temperature of the walls was kept at 60° C. whilst the pedestal was heated for 1½ hours at 225° C. The final pressure in the vessel was 214 bar. The experiment rendered a very thin and non-homogeneous green/blue film. Weight gain in this case was less than 1 mg.

Figure 6:
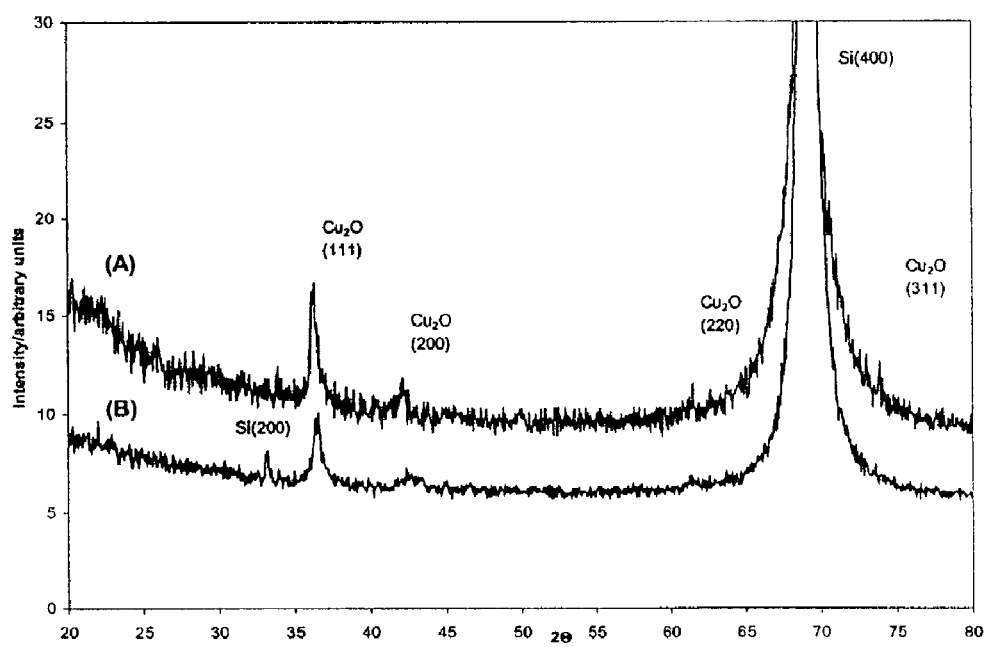
FIG. 6 is an XRD pattern of films deposited using (hfac)CuI(L)/$CO_2$ solutions without hydrogen: (A) Example 4, where L=COD, (B) Example 6, where L=vinyl trimethysilane (VTMS).

XRD of the film deposited in example 4 is shown in FIG. 6A showing only weak reflections due to Cu$_2$O apart from those of the Si substrate.

Figure 7:
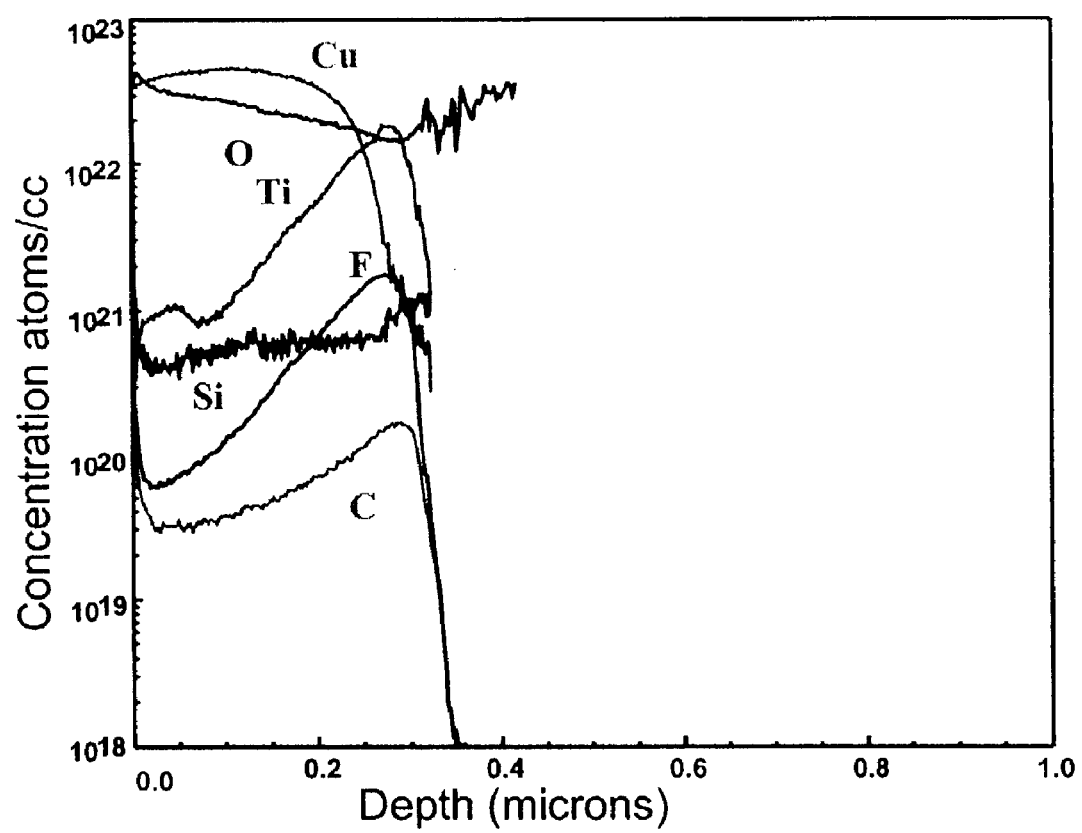
FIG. 7 is a SIMS analysis of a film deposited in Example 4 using(hfac)CuI(COD)/$CO_2$ solution without $H_2$.

FIG. 7 shows SIMS data of film deposited in Example 4 without H$_2$ showing very high O content in the sample. C and F contamination of the film is however much lower around 0.1 and 1 wt %, respectively.

Example 5

Batch Cu Deposition of Cu(I) Hexafluoroacetylacetonate Vinyltrimethylsilane Complex—Cu(II) Bis (hexafluoroacetylacetonate)[(hfac)Cu(VTMS)]/CO$_2$ Solutions with Hydrogen A 2 cm×2.1 cm silicon substrate with a 300 Å TiN barrier layer was sonicated first in toluene and then in acetone and dried in a convective oven. The experiment was conducted using the same stainless-steel high-pressure cold-wall reactor used in Examples 1 through 4 and a similar procedure to that described in Examples 1 and 3 except for differences in the method of loading the precursor. (hfac)Cu(VTMS) is a liquid at room temperature and was loaded to the reactor using 6-port HPLC sample valve (Valco, Inc.) with a 0.10 ml sample loop (0.149 g). The sample loop was loaded with the precursor in a glove box. In this case, before the precursor addition, the reactor walls were heated at ca. 60° C. by heating cartridges while purging the reactor with N$_2$. Then CO$_2$ was loaded from a high-pressure syringe pump (ISCO, Inc.) at 60° C. and 114 bar. The liquid precursor was then added to the reactor by pumping CO$_2$ at 60° C. and 117 bar through the sample loop. The total amount of CO$_2$ added to the reactor was ≈35 g. The concentration of (hfac)Cu$^I$(VTMS) in CO$_2$ was 0.43 weight %. (hfac)Cu$^I$(VTMS) was allowed to dissolve in CO$_2$ within the reactor for approximately 30 minutes. Afterwards, the pedestal was heated resistively to 225° C., while maintaining the reactor walls at 60° C. When the temperature of the stage reached 225° C., ≈7 bar of H$_2$ was added to the reactor from a 70 ml manifold via pressure-drop. This corresponds to a H$_2$ to precursor molar ration of approximately 48:1. The final pressure in the vessel was 228 bar. By keeping the walls at a temperature lower than the stage, selective deposition onto the hot area could be achieved. The stage was heated at 225° C. for 1½ hours. After the deposition experiment, the reactor was allowed to cool down and the effluent was vented through an activated carbon bed. The deposition rendered a thin bright copper colored film. The weight gain of the wafer was less than 1 mg.

Figure 8:
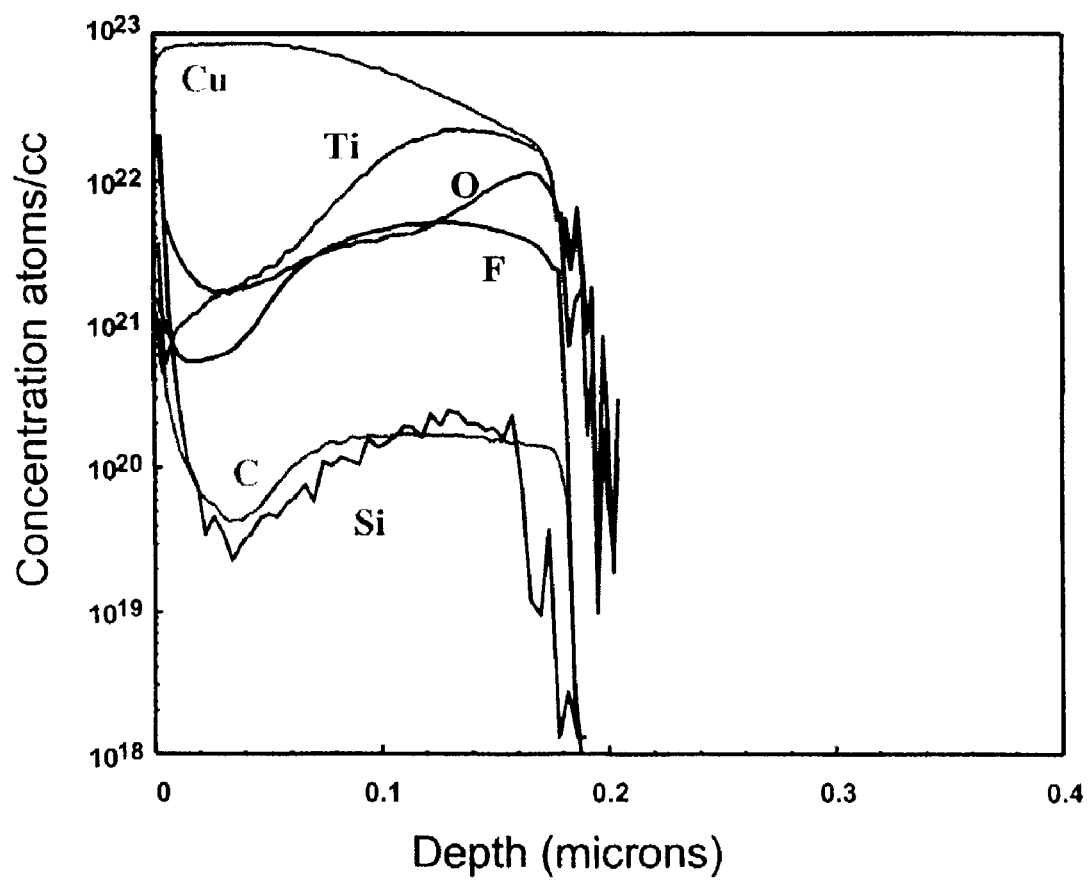
FIG. 8 is a SIMS analysis of a film deposited in Example 5 using (hfac)CuI(VTMS)/$CO_2$ solution with $H_2$.

FIG. 8 shows SIMS data of film deposited in Example 5. SIMS analysis of the film deposited in example 5 showed very low C and F contamination of the film (less than 0.1 and 1 at % respectively) in the bulk with an O content close to 2.5 wt %.

Example 6

Batch Cu Deposition of Cu(I)Hexafluoroacetylacetonate vinyltrimethylsilane Complex—Cu(II)bis (hexafluoroacetylacetonate)[(hfac)Cu(VTMS)]/$CO_2$ Solutions without Hydrogen Example 6 is similar to example 5, with the difference that in this case $H_2$ was not added to the reactor. The size of the TiN(Si) substrate was 2.15 cm×2.2 cm. 0.10 ml of (hfac)$Cu^I$(VTMS) (0.149 g) was loaded in the reactor with ≈40 g of $CO_2$ at 60° C. up to a final pressure of 124 bar following the procedure described in Example 5. The concentration of (hfac)$Cu^I$(VTMS) in $CO_2$ was 0.37% weight. The temperature of the walls was kept at 60° C. whilst pedestal was heated for 1½ hours at 225° C. The final pressure in the vessel was 228 bar. The experiment produced a very thin non-homogeneous yellow/green film. Weight gain in this case was less than 1 mg.

XRD of the film deposited in example 6 is shown in FIG. 6B. Only weak peaks due to $Cu_2O$ apart from those of the Si substrate were observed.

Figure 9:
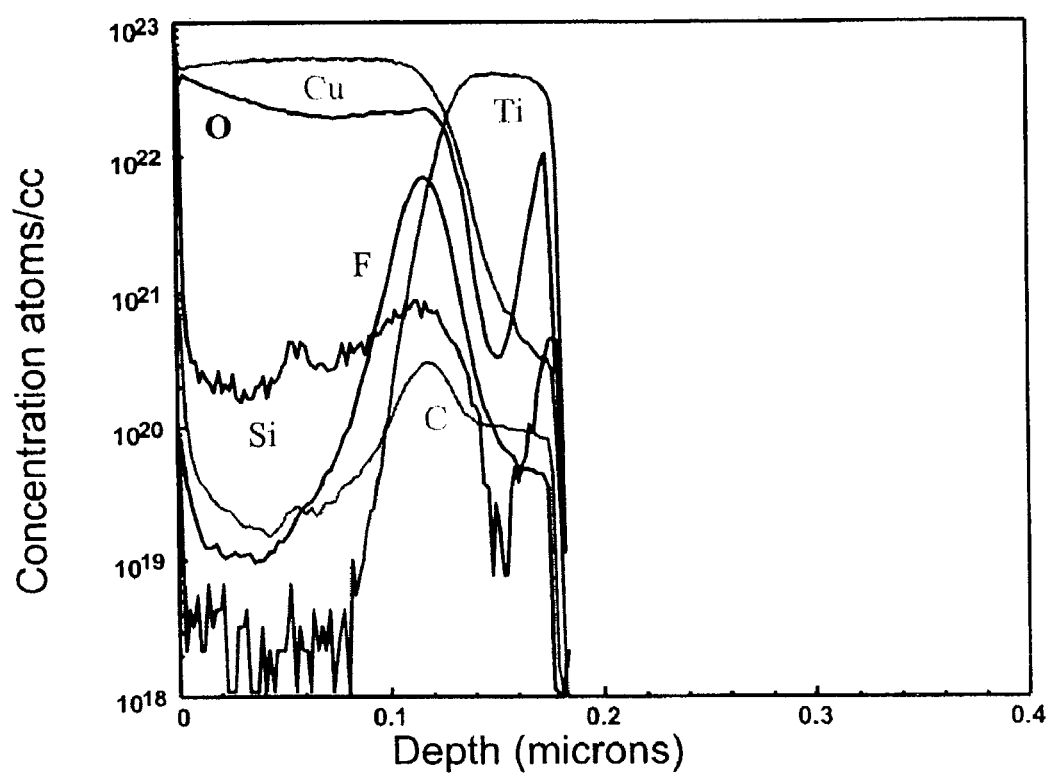
FIG. 9 is a SIMS analysis of a film deposited in Example 5 using (hfac)CuI(VTMS)/$CO_2$ solution without $H_2$.

FIG. 9 shows SIMS data of film deposited in Example 6. Oxygen content in the samples is very large in a Cu to O ratio close to 3 to 1. F and C contamination throughout the film represent less than 0.1 wt % in both cases.

Example 7

Batch Cu Deposition of (hfac)$Cu^I$(2-methyl-1-hexene-3-yne)/$CO_2$ Solutions with Hydrogen A 1.9×2 cm silicon substrate with a 300 Å TiN barrier layer was sonicated first in toluene and then in acetone and dried in a convective oven. The experiment was conducted using the same stainless-steel high-pressure cold-wall reactor used in Examples 1 through 6 and the same procedure described in Example 5. (hfac)$Cu^I$(2-methyl-1-hexene-3-yne) is a liquid at room temperature and was loaded to the reactor using a 6-port HPLC sample valve (Valco, Inc) with a 0.25 ml sample loop (0.350 g). Loading of the sample loop with the precursor was carried out in the glove box. Before the precursor addition, the reactor walls were heated to approximately 60° C. by heating cartridges while purging the reactor with $N_2$. Then $CO_2$ was loaded from a high-pressure syringe pump (ISCO, Inc.) at 60° C. and 114 bar. Then the liquid precursor was added to the reactor by pumping $CO_2$ at 60° C. and 117 bar through the sample loop. The total amount of $CO_2$ added to the reactor was ≈40 g. The concentration of (hfac)$Cu^I$(2-methyl-1-hexene-3-yne) in $CO_2$ was 0.87 weight %. (hfac)$Cu^I$(2-methyl-1-hexene-3-yne) was allowed to dissolve in $CO_2$ within the reactor for approximately 30 minutes. Afterwards, the pedestal was heated resistively to 225° C., while maintaining the walls at 60° C. When the temperature of the stage reached 225° C., approximately 17 bar of $H_2$ was added to the reactor from a 70 ml manifold via pressure-drop. This corresponds to a $H_2$ to precursor molar ration of ≈50. The final pressure in the vessel was 193 bar. By keeping the walls at a temperature lower than the stage, selective deposition onto the heated area was achieved. The stage was held at 225° C. for 1½ hours. After the deposition experiments, the reactor was allowed to cool down and the effluent was vented through an activated carbon bed. The deposition yielded a thin non-homogeneous copper-colored film. The weight gain of the wafer was ≈1.5 mg.

Figure 10:
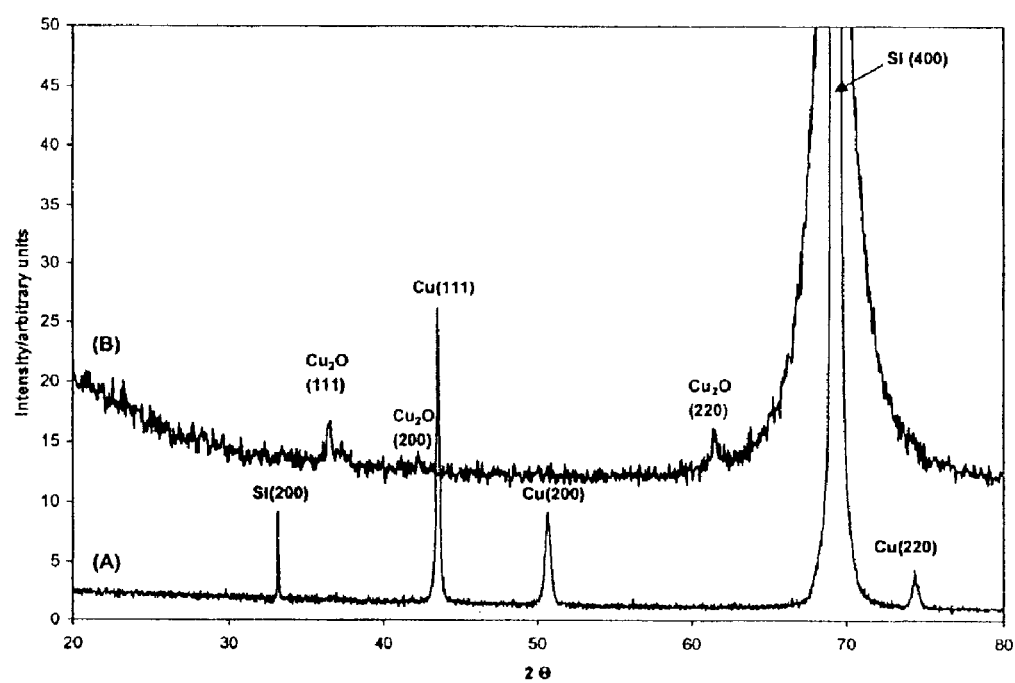
FIG. 10 is an XRD pattern of films deposited using (hfac)CuI(1-methyl-2-hexene-3-yne)/$CO_2$ solutions: (A) Example 7, with $H_2$, (B) Example 8, without $H_2$.

XRD of sample deposited in Example 7 in shown in FIG. 10. XRD shows only peaks corresponding to Cu apart from those of Si.

Example 8

Batch Cu Deposition of (hfac)$Cu^I$(2-methyl-1-hexene-3-yne)/$CO_2$ Solutions without Hydrogen Example 8 is similar to experiment 7, with the difference that in this case $H_2$ was not added to the reactor. The size of the TiN(Si) substrate was 2.1 cm×2.2 cm. 0.25 ml of (hfac)$Cu^I$(2-methyl-1-hexene-3-yne) (0.350 g) was loaded in the reactor with ≈39 g of $CO_2$ at 60° C. up to a final pressure of 117 bar following the procedure described in Example 7. The concentration of (hfac)$Cu^I$(2-methyl-1-hexene-3-yne) in $CO_2$ was 0.90% weight. The temperature of the walls was kept at 60° C. whilst pedestal was heated for 1½ hours at 225° C. The final pressure in the vessel was 183 bar. The experiment yielded a very thin non-homogenous green/yellow colored films. Weight gain in this case was less than 1 mg.

XRD of the film deposited in Example 8 is shown in FIG. 10B. Only weak peaks due to $Cu_2O$ apart from those of the Si substrate were observed.

Example 9

Batch Cu Deposition of (hfac)$Cu^I$(2-butyne)$_2$/$C_2F_6$ Solutions with Hydrogen A 2.1 cm×1 cm bare silicon substrate was sonicated first in toluene and then in acetone and dried in a convective oven. No attempt to remove the native $SiO_2$ layer was made. The experiment was conducted using the same stainless-steel high-pressure cold-wall reactor used in Examples 1 through 8. The test wafer was secured to the heated stage. 0.1195 g of (hfac)$Cu^I$(2-butyne) was loaded into the reactor inside a globe box and the vessel was sealed and purged with $N_2$. $C_2F_6$ was then loaded inside the reactor directly from the high-pressure cylinder (pressure ≈31 bar at room temperature). During the filling process, the temperature of the reactor was 22° C. The reactor was then heated to 60° C. using heating cartridges and allowed to equilibrate. At this temperature, the pressure inside the reactor increased to 45 bar. The density of $C_2F_6$ at these conditions calculated using the Peng-Robinson (PR) equation of state (EOS) (Peng and Robinson, Chem. *Ind. Eng. Chem. Fundam.*, 15, 59, 1976) and the critical parameters from Reid et al. (*The Properties of Gases and Liquids*, McGrawHill, Boston Mass., 1987) is 0.35 g.cm$^{-3}$. This value is slightly lower than that employed in the sc$CO_2$ experiments (Examples 1 through 8). The amount of $C_2F_6$ loaded in the vessel was approximately 30 g. The concentration of (hfac)Cu$^I$(2-butyne) in C$_2$F$_6$ was 0.40 weight %. (hfac)Cu$^I$(2-butyne) was allowed to dissolve in C$_2$F$_6$ inside the reactor for approximately 30 minutes. Then, the pedestal was heated resistively to 225° C., while maintaining the walls at 60° C. When the temperature of the stage reached 225° C., approximately 7 bar of H$_2$ was added to the reactor from a 70 ml manifold via pressure-drop. This corresponds to a H$_2$ to precursor molar ration of ≈53:1. The final pressure in the vessel was 72 bar. By keeping the walls at a temperature lower than the stage, selective deposition onto the heated area could be achieved. The stage was heated at 225° C. for 1½ hours. After the deposition experiments, the reactor was allowed to cool down and the effluent was vented through an activated carbon bed. The deposition rendered a bright copper-colored film. The weight gain of the wafer was less than 1 mg.

Figure 11:
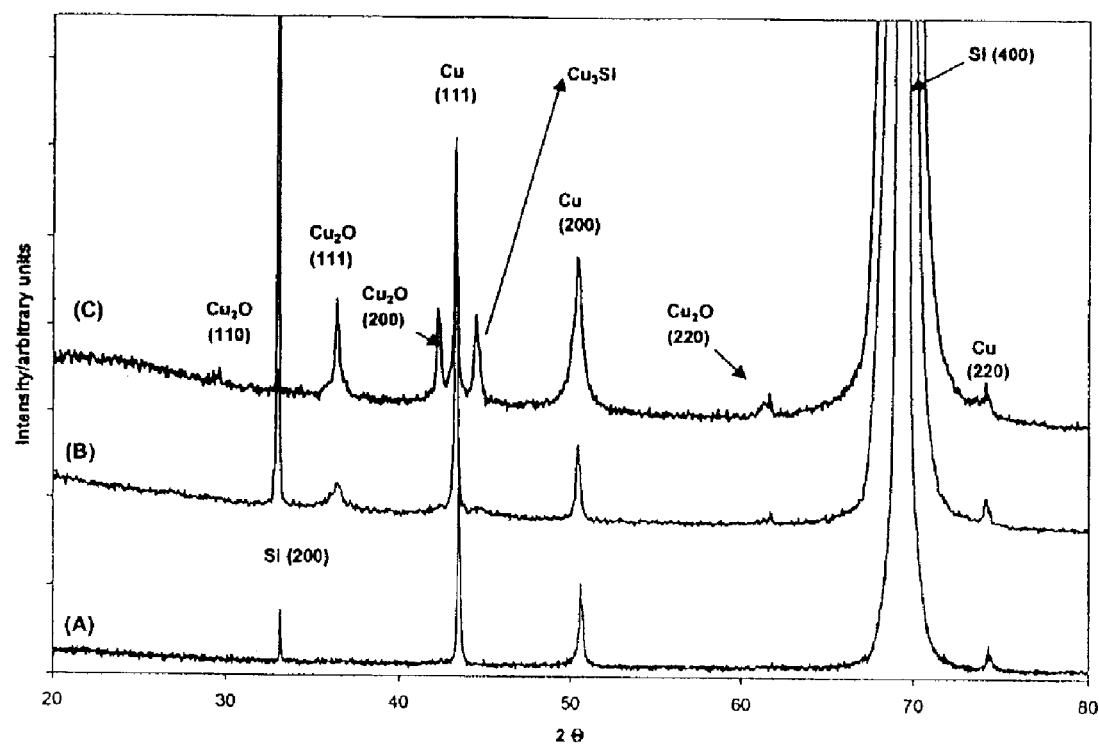
FIG. 11 is an XRD pattern of films deposited using (hfac)CuI(12-butyne)/$C_2F_6$ solution: (A) Example 9 at 225° C. with $H_2$, (B) Example 10 at 225° C. without $H_2$, (C) Example 11 at 250° C. without $H_2$.

Sample was identification as Cu by X-ray Diffraction (XRD). FIG. 11A shows the XRD diffraction pattern of the sample deposited in Example 9 showing peaks due to Cu and Si.

Example 10

Batch Cu Deposition of (hfac)Cu$^I$(2-butyne)$_2$/C$_2$F$_6$ Solutions without Hydrogen at 225° C.

Example 10 is similar to Example 9, with the difference that in this case H$_2$ was not added to the reactor. The size of the Si substrate was 2.0 cm×2.0 cm. 0.1622 g of (hfac)Cu$^I$(2-butyne) was loaded in the reactor into the reactor inside a globe box and the vessel was sealed and purged with N$_2$. In this example, C$_2$F$_2$ was loaded to the reactor via pressure drop from a 30 ml manifold in two successive loads. The amount of C$_2$F$_6$ loaded was determined from the mass difference of the manifold after each transfer and was approximately 44 g. The reactor walls were then heated at 60° C. using heating cartridges and the pressure inside the reactor increased to 52 bar. The density of C$_2$F$_6$ at 60° C. and 52 bar calculated using the PR EOS (Peng and Robinson, Chem. *Ind. Eng. Chem. Fundam.*, 15, 59, 1976) and the critical parameters from Reid et al. (*The Properties of Gases and Liquids*, McGrawHill, Boston Mass., 1987) is 0.45 g/cc. Under these conditions, the C$_2$F$_6$ loading density is very close to the CO$_2$ loading density used in Examples 1 through 8 (density of CO$_2$ 60° C. and 117 and 124 bars is 0.413 and 0.465 g.cm$^{-3}$, respectively from NIST ). The concentration of (hfac)Cu$^I$(2-butyne) in C$_2$F$_6$ was 0.37 weight %. (hfac)Cu$^I$(2-butyne) was allowed to dissolve in C$_2$F$_6$ within the reactor for approximately 30 minutes. Then, the pedestal was heated resistively to 225° C., while maintaining the walls at 60° C. The final pressure in the vessel was 90 bar. By keeping the walls at a temperature lower than the stage, selective deposition onto the heated area was achieved. The stage was heated at 225° C. for 1½ hours. After the deposition experiments, the reactor was allowed to cool down and the effluent was vented through an activated carbon bed. The deposition rendered a dark brown-reddish non-homogeneous film. The weight gain of the wafer was less than ≈1 mg.

The film was analyzed using X-ray Diffraction (XRD). FIG. 11B shows the XRD diffraction pattern of the sample deposited in Example 10 showing intense peaks due to Cu and weak reflections due to Cu$_2$O (200) and (400) Si peaks were also identified. A shoulder of the Cu (111) peak at 2Θ≈44.5 may correspond to an incipient Cu$_3$Si phase (reference).

Example 11

Batch Cu Deposition of (hfac)Cu$^I$(2-butyne)/C$_2$F$_6$ Solutions without Hydrogen at 250° C.

Example 11 is similar to Example 10, conducted without adding H$_2$ into the reactor but at a slightly higher reaction temperature. The size of the Si substrate was 2.1 cm×1.0 cm. 0.0903 g of (hfac)Cu$^I$(2-butyne) was loaded in the reactor into the reactor inside a globe box and the vessel was sealed and purged with N$_2$. C$_2$F$_6$ was then loaded inside the reactor directly from the high-pressure cylinder (pressure ≈31 bar at room temperature). During the filling process, the temperature of the reactor was 22° C. The reactor was then heated to 60° C. using heating cartridges and allowed to equilibrate. At this temperature, the pressure inside the reactor was 43 bar. The density of C$_2$F$_6$ at these conditions calculated using the PR EOS (Peng and Robinson, Chem. *Ind. Eng. Chem. Fundam.*, 15, 59, 1976) and the critical parameters from Reid et al. (*The Properties of Gases and Liquids*, McGrawHill, Boston Mass., 1987) is 0.35 g.cm$^{-3}$. This value is slightly lower than that employed in the scCO$_2$ experiments (Examples 1 through 8). The amount of C$_2$F$_6$ loaded in the vessel was approximately 29 g. The concentration of (hfac)Cu$^I$(2-butyne) in C$_2$F$_6$ was 0.31 weight %. (hfac)Cu$^I$(2-butyne) was allowed to dissolve in C$_2$F$_6$ within the reactor for approximately 30 minutes. Then, the pedestal was heated resistively at 250° C., while maintaining the walls at 60° C. The final pressure in the vessel was 69 bar. By keeping the walls at a temperature lower than the stage, selective deposition onto the heated area was achieved. The stage was heated at 225° C. for 1½ hours. After the deposition experiments, the reactor was allowed to cool down and the effluent was vented through an activated carbon bed. The deposition rendered a thin light brown/orange film. The weight gain of the wafer was less than ≈1 mg.

XRD of Example 11 is shown in FIG. 11C. Apart from the Si peaks, peaks due to both Cu and Cu$_2$O phases were easily identified. Comparison with FIG. 11B of Example 10 revealed that the intensity of the Cu$_2$O peaks in the XRD and therefore the amount of Cu$_2$O in the sample increased somewhat with deposition temperature. A strong peak at 2Θ≈44.5 suggests the presence of an increasing amount of Cu$_3$Si.

Example 12

Batch Cu Deposition of [(hfac)Cu$^I$(2-butyne)/CF$_3$H Solutions without Hydrogen A 2.2 cm×1 cm bare silicon substrate was sonicated first in toluene and then in acetone and dried in a convective oven. No attempt to remove the native SiO$_2$ layer was made. The experiment was conducted using the same stainless-steel high-pressure cold-wall reactor used in Examples 1 through 11. The test wafer was secured to the heated stage. 0.0982 g of (hfac)Cu$^I$(2-butyne) was loaded into the reactor inside a globe box and the vessel was sealed and purged with N$_2$. CF$_3$H was then loaded inside the reactor via pressure drop from a 30 ml manifold in two successive loads. The amount of CF$_3$H loaded was determined from the weigh difference of the manifold after each load and was ≈43 g. The reactor walls were then heated at 60° C. by heating cartriges and the pressure inside the reactor increased up to 83 bar. The density of CF$_3$H at 60° C. and 83 bar calculated using the PR EOS (Peng and Robinson, Chem. *Ind. Eng.*

Chem. Fundam., 15, 59, 1976) and the critical parameters from Reid et al. (*The Properties of Gases and Liquids*, McGrawHill, Boston Mass., 1987) is 0.40 g/cc. Under these conditions, the $CF_3H$ loading density is slightly lower than the $CO_2$ loading density used in Examples 1 through 8 (density of $CO_2$ 60° C. and 117 and 124 bars is 0.413 and 0.465 g.cm$^{-3}$, respectively [E. W. Lemmon, M. O. McLinden and D. G. Friend "Thermophysical Properties of Fluid Systems" in NIST Chemistry WebBook, NIST Standard Reference Database Number 69, Eds. P. J. Linstrom and W. G. Mallard, July 2001, National Institute of Standards and Technology, Gaithersburg Md., 20899 (http://webbook.nist.gov).]). The concentration of (hfac)Cu$^I$(2-butyne) in $CF_3H$ was 0.23 weight %. (hfac)Cu$^I$(2-butyne) was allowed to dissolve in $CF_3H$ inside the reactor for approximately 30 minutes. Then, the pedestal was heated resistively at 225° C., while keeping the walls at 60° C. The final pressure in the vessel was 138 bar. By keeping the walls at a temperature lower than the stage, selective deposition onto the heated substrate was achieved. The stage was heated at 225° C. for 1½ hours. After the deposition experiments, the reactor was allowed to cool down and the effluent was vented through an activated carbon bed. The deposition rendered a copper-like film slightly darker than those films produced with $H_2$.

Figure 12:
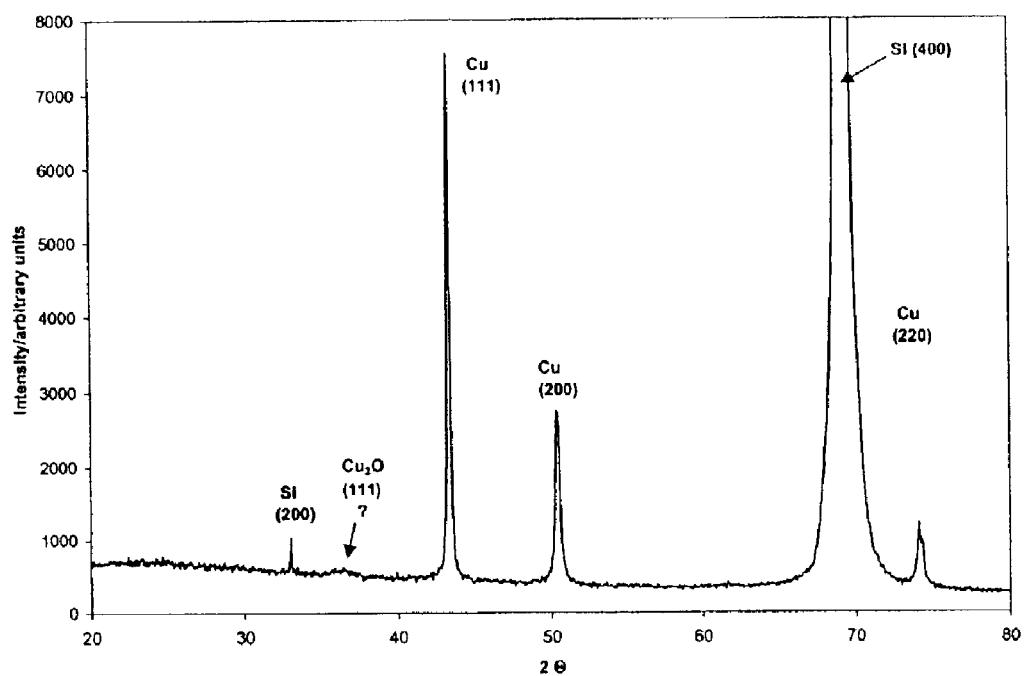
FIG. 12 is an XRD pattern of films deposited in Example 12 using (hfac)Cu$^I$(12-butyne)/$CF_3H$ solution at 225° C. without $H_2$.

FIG. 12 shows the XRD diffraction pattern of the sample deposited in Example 12. The analysis reveals intense peaks due to Cu and Si. A shoulder at $2\Theta \approx 36.5$ may correspond to an incipient $Cu_2O$ phase.

Example 13

Batch Cu Deposition of [(hfac)Cu$^I$(2-butyne)/$CO_2$ Solutions with Ethanol

Figure 13:
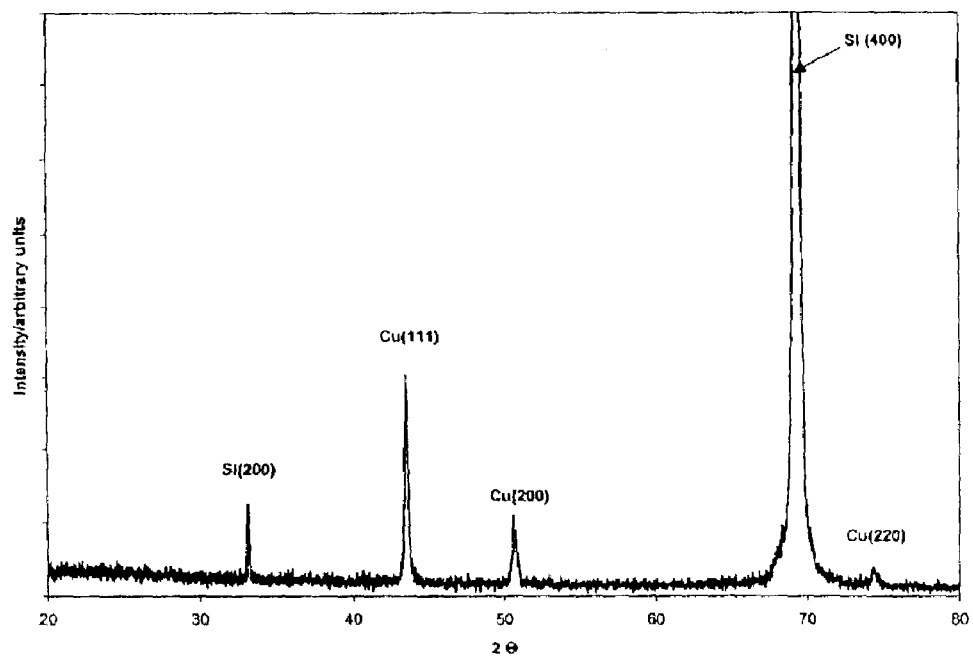
FIG. 13 is an XRD pattern of films deposited in Example 13 using (hfac)Cu$^I$(12-butyne)/$CO_2$ solution at 225° C. adding EtOH.

A 0.9 cm×1.9 cm silicon substrate with a 300 Å TiN barrier layer was sonicated first in toluene and then in acetone and dried in a convective oven. The experiment was conducted using the same stainless-steel high-pressure cold-wall reactor used in Examples 1 through 12 and a similar procedure to that described in Examples 2 but adding EtOH to the reactor. 0.1965 g of (hfac)Cu$^I$(2-butyne) was loaded into the reactor in the glove box and the vessel was sealed and purged with $N_2$. Then, the reactor walls were heated at 60° C. by heating cartriges and $CO_2$ was loaded from a high-pressure syringe pump (ISCO, Inc.) at 60° C. and 110 bar with ≈27 g of $CO_2$ (hfac)Cu$^I$(2-butyne) was allowed to dissolve in $CO_2$ inside the reactor for around 30–45 minutes. Then 2 ml of EtOH were loaded to the reactor using 6-port HPLC sample valve (Valco, Inc.) with a 2 ml sample loop (1.58 g). EtOH was then added to the reactor by pumping $CO_2$ at 60° C. and 117 bar through the sample loop. The total amount of $CO_2$ added to the reactor was ≈32 g. The concentration of (hfac)Cu$^I$(2-butyne) in $CO_2$ was 0.71 weight %. The concentration of EtOH in $CO_2$ was approximately 4.5 mol %. After EtOH addition the pedestal was heated resistively at 225° C., while keeping the walls at 60° C. The final pressure in the vessel was 188 bar. By keeping the walls at a temperature lower than the stage, selective deposition onto the hot area could be achieved. The stage was heated at 225° C. for 1½ hours. After the deposition experiments, the reactor was allowed to cool down and the effluent was vented through an activated carbon bed. The deposition rendered a copper-colored film that was darker than the films deposited using $H_2$. FIG. 13 shows XRD of film deposited in Example 13. The analysis reveals intense peaks due to Cu and Si indicating that the addition of EtOH effectively suppressed Cu oxidation during deposition.

OTHER EMBODIMENTS

It is understood that while the invention has been described in conjunction with the detailed description thereof, the foregoing description is intended to illustrate and not limit the scope of the appended claims.

Other aspects, advantages, and modifications are within the scope of the following claims.

What is claimed is:

1. A method for reducing contamination of a layer of a first material deposited onto a surface of a substrate, the method comprising:
   i) selecting a precursor of the deposit material and a solvent, wherein the precursor thermally dissociates under conditions at which the solvent is a supercritical or near-supercritical fluid;
   ii) dissolving the precursor into the solvent to form a supercritical or near-supercritical solution; and
   iii) exposing the substrate to the solution under conditions at which the precursor thermally dissociates while maintaining supercritical or near-supercritical conditions, thereby forming the layer of the first material on the surface of the substrate,
   wherein the layer comprises at least 95 weight percent of the first material and a substantial portion of the first material in the layer is provided by the thermal dissociation of the precursor.

2. The method of claim 1, wherein the precursor thermally dissociates by thermal disproportionation.

3. The method of claim 1, wherein the temperature of the substrate is maintained at more than 150° C.

4. The method of claim 1, wherein the solvent has a reduced temperature between 0.8 and 2.0.

5. The method of claim 1, wherein the solvent has a density of at least 0.1 g/cm$^3$.

6. The method of claim 1, wherein the solvent has a density of at least one third of its critical density.

7. The method of claim 1, wherein the solvent has a critical temperature of less than 150° C.

8. The method of claim 1, wherein the layer comprises at least 98 weight percent of the first material.

9. The method of claim 1, wherein the first material is a metal or an alloy.

10. The method of claim 9, wherein the metal is copper.

11. The method of claim 9, wherein contaminants of the layer include an oxide of the metal.

12. The method of claim 1, further comprising providing a reaction reagent that reduces contamination of the layer of the first material by reacting with a contaminant to form the material or to form a reaction product that is soluble in the solvent.

13. The method of claim 12, wherein the reaction reagent is a reducing agent.

14. The method of claim 12, wherein the reducing agent comprises hydrogen.

15. The method of claim 12, wherein the first material is copper and the reaction reagent reduces the amount of copper oxide formed on the surface of the substrate.

16. The method of claim 1, wherein the precursor comprises an organo-metallic complex.

17. The method of claim 16, wherein the organo-metallic complex comprises a Cu(I) complex or a Cu(II) complex.

18. The method of claim 1, wherein the precursor comprises a ligand, and upon dissociation of the precursor the ligand provides a reaction reagent to the solution that reduces contamination of the layer of the first material deposited on the surface of the substrate.

19. The method of claim 18, wherein the reaction reagent reduces oxidation of the first material deposited on the surface of the substrate.

20. The method of claim 1, wherein the substrate is a patterned substrate.

21. A method for forming a layer of a first material deposited onto a surface of a substrate, the method comprising:
   i) selecting a precursor of the first material and a solvent, wherein the precursor dissociates under conditions at which the solvent is a supercritical or near-supercritical fluid;
   ii) dissolving the precursor into the solvent to form a supercritical or near-supercritical solution;
   iii) exposing the substrate to the solution under conditions at which the precursor thermally dissociates and the first material forms on the surface of the substrate while maintaining supercritical or near-supercritical conditions, wherein a substantial portion of the first material in the layer is provided by the thermal dissociation of the precursor; and
   iv) mixing a reaction reagent into the solution, wherein the reaction reagent reduces contamination of the layer of the first material.

22. The method of claim 21, wherein the precursor is a Cu(I) complex.

23. The method of claim 21, wherein the reaction reagent is a reducing agent.

24. The method of claim 21, wherein the reaction reagent reduces contamination of the first material by reducing an oxide of the first material to form the first material.

25. The method of claim 21, wherein the first material is a metal.

26. The method of claim 25, wherein the reaction reagent reduces contamination by reducing oxidation of the metal.

27. The method of claim 21, wherein the solvent comprises $CO_2$.

28. The method of claim 21, wherein the solvent comprises a reducing agent.

29. A method for forming an integrated circuit, the method comprising:
   i) dissolving a precursor of a first material into a solvent to form a supercritical or near-supercritical solution;
   ii) exposing a substrate to the solution under conditions at which the precursor thermally dissociates while maintaining supercritical or near-supercritical conditions, thereby depositing the first material onto the surface of the substrate, wherein the layer comprises at least 95 weight percent of the first material and a substantial portion of the first material in the layer is provided by the thermal dissociation of the precursor; and
   iii) processing the substrate or first material, or both, to create the integrated circuit.

30. The method of claim 29, wherein the material is a metal or an alloy.

31. The method of claim 29, further comprising providing a reaction reagent that reduces contamination of the first material on the surface of the substrate.

32. The method of claim 31, wherein the reaction reagent reduces oxidation of the first material.

33. An integrated circuit formed by the method of claim 29.

34. A substrate coated with a film deposited by the method of claim 1.

* * * * *